(12) United States Patent
Shimoosako et al.

(10) Patent No.: US 8,092,900 B2
(45) Date of Patent: Jan. 10, 2012

(54) SOLUTION, COMPONENT FOR PLATING, INSULATING SHEET, LAMINATE, AND PRINTED CIRCUIT BOARD

(75) Inventors: Kanji Shimoosako, Kyotanabe (JP); Takashi Ito, Otsu (JP); Masaru Nishinaka, Otsu (JP); Shigeru Tanaka, Settsu (JP); Mutsuaki Murakami, Settsu (JP)

(73) Assignee: Kaneka Corporation, Osaka-shi (JP)

( * ) Notice: Subject to any disclaimer, the term of this patent is extended or adjusted under 35 U.S.C. 154(b) by 979 days.

(21) Appl. No.: 11/659,363

(22) PCT Filed: Aug. 4, 2005

(86) PCT No.: PCT/JP2005/014353
§ 371 (c)(1),
(2), (4) Date: Jul. 6, 2007

(87) PCT Pub. No.: WO2006/013950
PCT Pub. Date: Feb. 9, 2006

(65) Prior Publication Data
US 2008/0314618 A1 Dec. 25, 2008

(30) Foreign Application Priority Data

| Aug. 5, 2004 | (JP) | 2004-229775 |
| Sep. 22, 2004 | (JP) | 2004-274860 |
| Nov. 19, 2004 | (JP) | 2004-336789 |
| Nov. 19, 2004 | (JP) | 2004-336790 |
| Nov. 30, 2004 | (JP) | 2004-346809 |
| Jan. 18, 2005 | (JP) | 2005-010336 |
| Mar. 17, 2005 | (JP) | 2005-078093 |
| Apr. 28, 2005 | (JP) | 2005-133609 |

(51) Int. Cl.
*B32B 15/08* (2006.01)
(52) U.S. Cl. ..... 428/209; 428/141; 428/458; 428/473.5; 428/901
(58) Field of Classification Search .................. 428/458, 428/473.5, 141, 209, 901
See application file for complete search history.

(56) References Cited

U.S. PATENT DOCUMENTS

| 5,178,914 A * | 1/1993 | Goldblatt et al. ............. 427/306 |
| 5,411,795 A * | 5/1995 | Silverman ..................... 442/231 |
| 5,859,181 A * | 1/1999 | Zhao et al. ..................... 528/353 |
| 2003/0049487 A1 | 3/2003 | Katsuki et al. |
| 2003/0170431 A1* | 9/2003 | Oguni et al. .................. 428/209 |
| 2005/0158574 A1* | 7/2005 | Suzuki et al. ................. 428/618 |
| 2006/0048963 A1* | 3/2006 | Nishinaka et al. ........... 174/52.2 |
| 2006/0115670 A1 | 6/2006 | Tanaka et al. |
| 2007/0269665 A1 | 11/2007 | Shimoohsako et al. |

FOREIGN PATENT DOCUMENTS

| EP | 0773710 A1 | 5/1997 |
| JP | 07-66329 A | 3/1995 |
| JP | 8-330728 A | 12/1996 |
| JP | 2000-198907 A | 7/2000 |
| JP | 2000-290606 A | 10/2000 |
| JP | 2002-264255 A | 9/2002 |
| JP | 2003-7138 A | 1/2003 |
| JP | 2004-10660 A | 1/2004 |
| JP | 2004-14611 A | 1/2004 |
| JP | 2004-189981 A | 7/2004 |
| WO | WO 2004/050352 A1 * | 6/2004 |

OTHER PUBLICATIONS

Partial English translation of JP 2002-264255-A, Sep. 18, 2002.
Partial English translation of JP-2000-198907-A, Jul. 18, 2000.
Partial English translation of JP-2000-290606-A, Oct. 17, 2000.
Partial English translation of JP-2004-10660-A, Jan. 15, 2004.
Partial English translation of JP-2003-7138-A, Jan. 10, 2003.
U.S. Office Action issued in co-pending U.S. Appl. No. 11/665,226 on Feb. 17, 2011.

* cited by examiner

*Primary Examiner* — D. S. Nakarani
(74) *Attorney, Agent, or Firm* — Birch, Stewart, Kolasch & Birch, LLP

(57) ABSTRACT

It is an object of the present invention to provide a component for plating suitably used in, for example, producing a printed circuit board, a solution, and a printed circuit board including the component, the component for plating having satisfactory adhesion to an electroless plating film provided on a surface of the component even when the surface roughness of the surface of the component is small. The object is achieved by a component for electroless plating including at least a surface a for electroless plating, the surface a having a surface roughness of 0.5 μm or less in terms of arithmetic average roughness measured with a cutoff value of 0.002 mm, and the surface a containing a polyimide resin having a siloxane structure.

1 Claim, No Drawings

US 8,092,900 B2

SOLUTION, COMPONENT FOR PLATING, INSULATING SHEET, LAMINATE, AND PRINTED CIRCUIT BOARD

The present application is a 371 national phase application of PCT/JP2005/014353, filed Aug. 4, 2005, the entire disclosure of which is hereby incorporated by reference.

TECHNICAL FIELD

The present invention relates to a solution, a component for plating, and an insulating sheet that are suitably used in performing electroless plating, and the present invention also relates to a laminate and a printed circuit board produced with the solution, the component for plating, and the insulating sheet. In particular, the present invention relates to a solution, a component for plating, and an insulating sheet that are suitably used in producing a printed circuit board, and the present invention also relates to a laminate and a printed circuit board produced with the solution, the component for plating, and the insulating sheet.

BACKGROUND ART

Electroless plating for depositing a metal on a base by decomposing a reductant in an aqueous solution of a metal salt and then reducing the metal salt without electrical energy is a technique that has been widely applied to functionalize the surfaces of insulating materials, for example, various plastics, glass, ceramic, or wood. For example, a component composed of an ABS resin, a polypropylene resin, or the like is subjected to electroless plating to produce a grille, a mark, or the like used for an automobile or a knob or the like used for a household electrical appliance. Such electroless plating is referred to as "decorative plating". Furthermore, a through hole in a printed circuit board is subjected to electroless plating. Such electroless plating is referred to as "functional plating".

However, an electroless-plating film often has low adhesion to the surface of each of the various materials. In particular, when electroless plating is applied to the production of the printed circuit board, an electroless plating film disadvantageously has low adhesion to an insulating material. In particular, when a method for forming a film by electroless plating is employed as a method for forming a metal layer directly on the surface of an insulating material, it is remarkably difficult to strongly bond the electroless plating film to the smooth surface of an insulating material having small surface roughness.

As a reason for this, in electroless plating, it is assumed that the film is deposited via a catalyst mainly composed of palladium or the like.

On the other hand, for example, in producing a printed circuit board having lines on a surface thereof, when an electroless plating film is provided on an insulating material, it is highly desirable that the electroless plating film be strongly bonded to a surface with a maximum degree of smoothness. The reasons are described as follows.

In printed circuit boards widely used for mounting electronic components and semiconductor devices, trends toward miniaturization and greater functionality of electronic devices nowadays strongly require higher density of wiring and a reduction in thickness. In particular, establishment of a method for forming a fine-pitch circuit having a line and space resolution of 25 μm/25 μm or less is an important challenge in the field of the printed circuit board. An example of an insulating layer used for the printed circuit board is an insulating sheet on which lines can be formed.

To form such a fine-pitch circuit, such an insulating sheet is required to have high adhesion to the fine-pitch circuit and adequately small surface roughness so as not to adversely affect the formation of the fine-pitch circuit. In other words, when the fine-pitch circuit is formed, a line shape, a line width, a line thickness, or the like cannot be satisfactorily achieved according to the design unless the irregularities of the surface of the insulating sheet are controlled as small as possible. Accordingly, it is highly desirable that the electroless plating film be strongly bonded to a surface with a maximum degree of smoothness.

In recent years, to improve information-processing abilities in electronic devices, there have been advances in increases in speed and frequency of electrical signals transmitting through circuits on printed circuit boards used in the electronic devices. Thus, even when the electrical signals have higher frequencies, the printed circuit boards are required to maintain electrical reliability and to suppress a reduction in the transmission rate of the electrical signals through the circuit and the loss of the electrical signals through the circuit. In particular, in printed circuit boards, such as multilayer flexible printed circuit boards and build-up printed circuit boards mounting semiconductor chips by flip-chip, the increases in speed and frequency of the electrical signals is significant. When electrical signals have higher speeds and higher frequencies, the surface roughness of the surface of a conducting circuit is desirably minimized for reducing the transmission loss of the signals. Accordingly, also from the standpoint of a material that permits increases in speed and frequency of electrical signals, it is necessary that the electroless plating film be strongly bonded to the surface of an insulating sheet with low surface roughness.

The most preferred insulating sheet for forming fine lines is an insulating sheet functioning as an insulating layer having a surface with very slight irregularities and sufficiently high adhesion to fine lines.

Known insulating sheets used for printed circuit boards have adhesion to electroless-plating films by anchoring effects of roughened surfaces obtained by various processes (for example, see Patent Document 1). However, small surface roughness results in low adhesion between an electroless-plating film and a resin component, thereby limiting the formation of fine lines.

For example, to improve adhesion to circuit wiring provided on the surface of a resin component having small surface roughness, a process of forming a primary metal layer on a surface of a polyimide film by a physical method, such as evaporation or sputtering, and forming a copper layer, which is a good conductor, is disclosed (see Patent Document 2). In this case, the adhesion strength between the primary metal layer and the polyimide film is high. However, this adhesion is not induced by the chemical binding force between the polyimide film and the metal. The adhesion is caused by providing the primary layer, in other words, the adhesion results from the fact that the primary layer microscopically anchors to the surface of the base and is linked to the copper layer by a metal-to-metal bond. However, in this process, the primary layer is composed of a metal other than copper. Thus, the primary layer is not completely removed using an etching solution for copper, in some cases. As a result, migration resistance between lines may be impaired. Furthermore, the process has disadvantages of high cost and low productivity due to use of a vacuum process.

A technique of bonding layers with an interlayer insulating adhesive containing a polyimidesiloxane is disclosed (for example, see Patent Document 3). However, in the technique described in Patent Document 3, a polyimide having a siloxane structure is used as an interlayer adhesive and is used for bonding a circuit substrate. Use as a layer for providing an electroless-plating film thereon is not disclosed.

A resin-containing metal foil produced by applying a polyimide precursor having a siloxane structure onto the metal foil and laminating a plating metal layer is disclosed (Patent Document 4). However, with respect to a production process of the metal layer, electroless plating is described in parallel with chromium sputtering or the like. The relationship between the adhesion strength of an electroless plating film, which is believed to have low adhesion to an insulating material, and surface roughness of a surface intended to be provided with an electroless-plating film is not confirmed in Patent Document 4.

Accordingly, the adhesion of an electroless-plating film to a smooth surface is not described in any document. In the present circumstances, no material capable of strongly bonding an electroless-plating film to a smooth surface thereof is found so far.

Furthermore, an insulating resin material used for a printed circuit board is required to have not only adhesion between an electroless-plating film and the resin material but also lower linear expansivity, in some cases.

In producing a multilayer flexible printed circuit board or a build-up circuit board, an insulating sheet is laminated to a conducting circuit provided on a substrate. The insulating sheet is required to have the ability to flow and fill in gaps between lines in the circuit in lamination; and to strongly adhere to the conducting circuit and to an insulating film having the circuit. That is, the insulating sheet is required to have satisfactory adhesion to an inner circuit, a substrate, and the like and flowability to the extent that the insulating sheet can fill in the gaps between lines in the circuit.

Furthermore, in producing a printed circuit board, the formation of a via hole, which electrically connects both sides of the circuit board, is essentially required. Thus, in such a printed circuit board, in general, steps, such as a via hole-forming step by laser, a desmearing step, a catalyst-adding step, and an electroless-copper-plating step, are performed to form lines. Moreover, usually, a semi-additive process including a step of forming a resist film, a step of subjecting the exposed portion of an electroless-plating film to electrolytic copper plating, a step of removing the resist film, and a step of etching an excess of the electroless-plating film is often employed for forming fine lines. Accordingly, the adhesion between the fine lines and the insulating layer more preferably endures these processes.

By using insulating sheets that satisfy the above-described requirements, high-density printed circuit boards used for electronic devices that require high-speed and high-frequency electrical signals can be provided. Therefore, the realization of such insulating sheets has been strongly desired. However, any of Patent Documents 1 to 4 does not describe the fact that an electroless-plating film can be strongly bonded to a smooth surface. Furthermore, any of these documents does not describe about an application example to a build-up circuit board or the like and about durability to these processes. In addition, usage of an insulating sheet facing an inner circuit provided in advance and inner circuit-embedding properties are not considered.

Furthermore, in insulating materials for printed circuit boards used in electronic devices, from the standpoint of the maintenance of adhesion to components mounted and a conducting layer at high temperatures, as described above, trends toward lower linear expansivity of the insulating material have been demanded. In achieving higher performance and a speedup, the strength of semiconductor elements may decrease (become brittle). Furthermore, trends toward higher densities of printed circuit boards require mounting of components and substrates with higher accuracy, thereby reducing the allowable ranges of misalignments. When the linear expansion coefficient of the substrate is significantly different from that of the element, a change in the temperature of the substrate mounting the element results in differences in dimensions of the substrate and the element. As a result, stress occurs, causing the breakage of the connection between the substrate and the element and the breakage of the element. To avoid such problems, materials for printed circuit boards are required to have linear expansion coefficients close to those of semiconductor elements. In other words, materials for printed circuit boards are required to have lower linear expansion coefficients.

Any of Patent Documents 1 to 4 does not describe the fact that an electroless-plating film can be strongly bonded to a smooth surface. Furthermore, any of these documents does not describe about low linear expansivity. The point of a reduction in the linear expansion coefficient of the circuit board is not considered.

From the standpoint of decreasing linear expansion coefficient of a material, a technique for controlling a linear expansion coefficient and viscosity by incorporating a filler in a sealing resin for a semiconductor device is disclosed (see Patent Document 5). However, the technique does not relate to an interlayer insulating material for a printed circuit board and has not provided a material that has satisfactory heat resistance and processability and that is suitably used for a printed circuit board.

Attempts have been made to reduce linear expansion coefficients by incorporating inorganic fillers in epoxy adhesive materials, which are often used for circuit boards (Patent Documents 6 to 8). In insulating resin compositions described in Patent Documents 6 to 8, the incorporation of the inorganic fillers achieves reductions in linear expansion coefficients. However, the incorporation of the inorganic fillers increases the surface roughness of the adhesive material. As a result, a surface having low surface roughness required for the formation of fine circuits cannot be obtained. Thus, fine lines cannot be formed. Furthermore, the surface roughness of a conducting circuit provided on the insulating material also increases inevitably. The realization of high-speed and high-frequency electrical signals increases the transmission loss of signals. As a result, the insulating resin compositions cannot correspond to the high-speed and high-frequency electrical signals. Furthermore, as a result of studies by the inventors, the inventors found that the incorporation of the inorganic filler disadvantageously reduces insulation between lines in the circuit. Specifically, the present inventors found the following: Electroless plating copper is deposited in a minute gap between the insulating resin and the bottom of the filler exposed in the surface. When an attempt is made to remove the electroless plating copper layer in a subsequent etching step, the etchant does not sufficiently reach the gap. As a result, the electroless plating copper remains in the gap to degrade the insulation.

Therefore, in a known insulating material containing an inorganic filler, the incorporation of the inorganic filler reduces the linear expansion coefficient but increases the surface roughness. That is, the incorporation of the inorganic filler can reduce the linear expansion coefficient but cannot achieve the surface roughness on which fine lines can be formed or capable of corresponding to the high-speed and high-frequency electrical signals.

[Patent Document 1] Japanese Unexamined Patent Application Publication No. 2000-198907
[Patent Document 2] Japanese Unexamined Patent Application Publication No. 08-330728
[Patent Document 3] Japanese Unexamined Patent Application Publication No. 2000-290606
[Patent Document 4] Japanese Unexamined Patent Application Publication No. 2002-264255
[Patent Document 5] Japanese Unexamined Patent Application Publication No. 07-66329
[Patent Document 6] Japanese Unexamined Patent Application Publication No. 2004-14611 (Publication Date: Jan. 15, 2004)
[Patent Document 7] Japanese Unexamined Patent Application Publication No. 2004-10660 (Publication Date: Jan. 15, 2004)
[Patent Document 8] Japanese Unexamined Patent Application Publication No. 2003-7138 (Publication Date: Jan. 10, 2003)

DISCLOSURE OF INVENTION

Problems to be Solved by the Invention

As described in Background Art, no material having high adhesion to a resin material and an electroless-plating film even when surface roughness is small is found yet.

Accordingly, the present invention is accomplished to solve the problems described above. It is an object of the present invention to provide a component for plating in order to improve adhesion between an electroless-plating film and a material by providing the component on the surface of the material to be subjected to electroless plating. It is another object of the present invention to provide a solution and a component for plating that can be suitably used in applications such as functional plating on plastics, glass, ceramic, wood, and the like; decorative plating on grilles, marks, and the like used for automobiles or knobs and the like used for household electrical appliances; and, in particular, the production of printed circuit boards. Furthermore, it is another object of the present invention to provide an insulating sheet and a laminate that can be suitably used for producing printed circuit boards, such as flexible printed circuit boards, rigid printed circuit boards, multilayer flexible printed circuit board, multilayer rigid printed circuit boards, and build-up circuit boards, required for the formation of fine lines, and a printed circuit board including the insulating sheet and/or the laminate, Specifically, the present invention provides a component for plating, an insulating sheet, a laminate, and a printed circuit board as follows:
(1) a component for plating, the component capable of strongly bonding an electroless-plating film to the smooth surface;
(2) an insulating sheet capable of being suitably used for a printed circuit board or the like, capable of strongly bonding an electroless-plating film to the smooth surface, and having low linear expansivity;
(3) an insulating sheet capable of being suitably used for a printed circuit board or the like, capable of strongly bonding an electroless-plating film to the smooth surface, and having satisfactory inner circuit-embedding properties in facing an inner circuit provided in advance;
(4) an insulating sheet capable of being suitably used for a printed circuit board or the like, capable of strongly bonding an electroless-plating film to the smooth surface, capable of reducing the linear expansivity of a circuit board, and having well-balanced characteristics, such as inner-circuit embedding properties, heat resistance, and processability; and
(5) an insulating sheet capable of being suitably used for a printed circuit board or the like, having small surface roughness in spite of the addition of an inorganic filler, and capable of reducing linear expansivity by taking advantage of the addition of the inorganic filler.

Means for Solving the Problems

In view of the above problems, the present inventors have conducted intensive research and found that the problems can be solved by the following component for plating.
(1) A component for electroless plating includes at least a surface a for electroless plating, the surface a having a surface roughness of 0.5 μm or less in terms of arithmetic average roughness measured with a cutoff value of 0.002 mm, and the surface a containing a polyimide resin having a siloxane structure.
(2) In the component for electroless plating according to item (1), the polyimide resin having the siloxane structure is prepared by allowing an acid dianhydride component to react with a diamine component containing a diamine represented by general formula (1):

[Ch. 2]

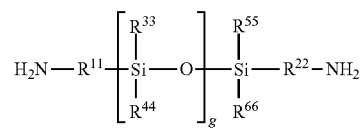

(wherein g represents an integer of 1 or more; $R^{11}$ and $R^{22}$ may be the same or different and each represent an alkylene group or a phenylene group; $R^{33}$ to $R^{66}$ may be the same or different and each represent an alkyl group, a phenyl group, a phenoxy group, or an alkoxy group).
(3) A single-layer sheet containing a polyimide resin having a siloxane structure includes a surface a for electroless plating, the surface a having a surface roughness of 0.5 μm or less in terms of arithmetic average roughness measured with a cutoff value of 0.002 mm.
(4) An insulating sheet includes at least two layers containing a layer A having at least a surface a for electroless plating, the surface a having a surface roughness of 0.5 μm or less in terms of arithmetic average roughness measured with a cutoff value of 0.002 mm, and the layer A containing a polyimide resin having a siloxane structure.
(5) In the insulating sheet according to item (4), one outermost layer is the layer A having the surface a for electroless plating, and the other outermost layer is a layer B for facing a circuit separately provided.
(6) In the insulating sheet according to item (5), the layer A having the surface a for electroless plating is provided on one surface of a polymeric film layer C, and the layer B for facing a circuit separately provided is provided on the other surface of the polymeric film layer C.
(7) In the insulating sheet according to item (5) or (6), the layer B for facing the circuit separately provided contains a thermosetting resin.
(8) In the insulating sheet according to item 7, the thermosetting resin is an epoxy resin.
(9) In the insulating sheet according to item (5) or (6), the layer B for facing the circuit separately provided contains a thermoplastic polyimide resin and a thermosetting component.

(10) In the insulating sheet according to any one of items (5) to (9), the B-stage layer B for facing the circuit separately provided has a melt viscosity of 20,000 Pa·s or less.

(11) In the insulating sheet according to any one of items (5) to (9), the layer B for facing the circuit separately provided contains at least 5 percent by volume of a filler.

(12) In the insulating sheet according to item (11), the filler is spherical fused silica.

(13) In the insulating sheet according to item (11) or (12), the filler is subjected to surface treatment with a silane-based or titanium-based coupling agent or surface-treating agent.

(14) In the insulating sheet according to item (4), the insulating sheet includes the layer A having the surface a for electroless plating/a polymeric film layer C.

(15) In the insulating sheet according to item (13), the insulating sheet includes the layer A having the surface a for electroless plating/a polymeric film layer C/a layer A' having the surface a' for electroless plating.

(16) In the insulating sheet according to item (15), the surface a' has a surface roughness of 0.5 µm or less in terms of arithmetic average roughness measured with a cutoff value of 0.002 mm.

(17) In the insulating sheet according to any one of items (6), (14), and (15), the polymeric film is a non-thermoplastic polyimide film.

(18) In the insulating sheet according to any one of items (6), (14), and (15), the thickness of the layer A is less than or equal to that of the layer C.

(19) In the insulating sheet according to any one of items (6), (14), and (15), the tensile modulus of the layer A is less than or equal to that of the layer C.

(20) The insulating sheet according to any one of items (5), (6), (14), and (15) further includes a support provided on a surface of the layer A and/or a surface of the layer B.

(21) In the insulating sheet according to any one of items (3), (4), (5), (6), (14), and (15), the single-layer sheet or the insulating sheet contains an inorganic filler, and the content x of the inorganic filler present in one surface layer X and the content y of the inorganic filler present in the other surface layer Y satisfy the following relationship:

x<y (wherein x and y each represent percent by volume per unit volume).

(22) In the insulating sheet according to item (5) or (6), the content a of an inorganic filler in the outermost layer A and the content b of the inorganic filler in the outermost layer B satisfy the relationship a<b.

(23) In the insulating sheet according to any one of items (5), (6), and (22), the thickness of the outermost layer A is smaller than that of the outermost layer B.

(24) A laminate includes an electroless plating film on the layer A or the layer A' of the insulating sheet according to any one of items (6) to (19).

(25) In the laminate according to item (24), the electroless plating film is an electroless copper plating film.

(26) A printed circuit board includes the insulating sheet according to any one of items (3), (4), (5), (6), (14), and (15) or the laminate according to item (24) or (25).

(27) A solution includes a polyimide resin having a siloxane structure, the solution being used for forming the surface a according to item (1).

(28) A solution includes a polyamic acid that is a precursor of a polyimide having a siloxane structure, the solution being used for forming the surface a according to item (1).

(29) An insulating sheet includes one outermost layer containing a polyimide resin having a siloxane structure, and the other outermost layer containing a thermosetting component.

(30) An insulating sheet includes a layer containing a thermoplastic polyimide resin having a siloxane structure on one surface of a non-thermoplastic polyimide film layer, and a layer containing a thermoplastic polyimide resin and a thermosetting component on the other surface of the non-thermoplastic polyimide film layer.

Advantages

The present invention provides a component having high adhesion strength to an electroless plating layer even when the surface roughness is small, the component having a surface a for electroless plating, the surface a being composed of a polyimide resin having a predetermined structure. Furthermore, the component has excellent adhesion to various other components. Thus, the component for plating of the present invention is formed on a surface of a component intended to be subjected to electroless plating, and then electroless plating is performed. Thereby, the component for plating of the present invention is advantageously strongly bonded to the electroless-plating film.

Furthermore, in the case of an insulating sheet including at least two layers containing the layer A, in order to satisfy characteristics required for use in a printed circuit board, the insulating sheet has well-balanced characteristics by separating the functions.

For example, the outermost layer A, i.e., the layer for forming an electroless-plating film, is composed of the polyimide resin having a siloxane structure. Thus, adhesion strength to the electroless-plating film is high even when the surface roughness is small. Furthermore, an insulating sheet has satisfactory processability, such as good bondability between the insulating sheet according to the present invention and an inner circuit board under low-temperature and low-pressure conditions and the ability of filling in gaps between lines in the circuit by providing the layer B serving as a layer for facing a circuit provided. In addition, the insulating sheet also has low linear expansivity.

An insulating component including the layer A having the surface a for electroless plating in combination with the polymeric film layer C has high adhesion strength to an electroless plating layer even when surface roughness is small and has low linear expansivity.

In the case of the insulating sheet containing an inorganic filler, by adjusting the content of the inorganic filler in a surface layer for electroless plating, the insulating sheet not only can be strongly bonded to an electroless plating copper film because of low surface roughness but also has low linear expansivity. Furthermore, the insulating sheet has satisfactory adhesion to a resin material and a conducting material, processability, heat resistance, resin flowability, and dielectric properties in the GHz band.

The component for plating and the insulating sheet of the present invention have satisfactory heat resistance because of inclusion of a polyimide resin and are thus suitably used in producing printed circuit boards. Furthermore, by taking advantage of high adhesion strength to electroless-plating film without surface roughening, the component for plating and the insulating sheet of the present invention can be suitably used for, for example, producing printed circuit boards, such as flexible printed circuit boards, rigid printed circuit boards, multilayer flexible printed circuit boards, and build-up circuit boards, requiring the formation of fine lines.

BEST MODE FOR CARRYING OUT THE INVENTION

Embodiments of the present invention will be described in detail below. The present invention is not limited to the following description.

[Structure of Component for Plating According to the Present Invention]

A component for plating according to the present invention is a component for electroless plating, the component having at least a surface a for electroless plating, the surface a having a surface roughness of 0.5 μm or less in terms of arithmetic average roughness measured with a cutoff value of 0.002 mm, and the surface a containing a polyimide resin having a siloxane structure.

Since the polyimide resin having the siloxane structure is used for the surface a, an electroless plating film can be strongly bonded to the surface a even when the surface a has a very small surface roughness of 0.5 μm or less in terms of arithmetic average roughness measured with a cutoff value of 0.002 mm.

Interlayer adhesives each composed of a polyimide having a siloxane structure have been known. However, in the case in which the polyimide is used for a layer for electroless plating to form a film, the present inventors first focus on the relationship between the surface roughness of the layer and the adhesive strength to the electroless plating film. Usually, the relationship is not considered when the layer is used as the interlayer adhesive. The present inventors studied the relationship between the surface roughness of the layer and the adhesive strength to the electroless plating film, and found that satisfactory adhesion was achieved even when the surface roughness is small.

The component for plating according to the present invention may have any structure and shape as long as the component has the surface a. For example, when the component for plating according to the present invention is used for a printed circuit board, a single-layer sheet having a smooth surface a as described above and composed of a polyimide resin having a siloxane structure may be used. Alternatively, when the component for plating according to the present invention has a structure including at least two layers containing a layer A having the surface a, the adhesion of an electroless plating film to such a smooth surface and other functions required for the printed circuit board are separated. Thereby, it is possible to achieve a balance of characteristics which are usually difficult to balance. Specific examples of such an insulating sheet having a single-layer or at least two layers will be described below.

To obtain the component for plating according to the present invention, a solution containing a polyimide resin is preferably used. Alternatively, to obtain the component for plating according to the present invention, a solution containing a polyamic acid serving as a precursor of a polyimide resin is preferably used.

The component for plating according to the present invention should have at least the surface a for electroless plating. A method of forming the component for plating according to the present invention on the surface of a component intended to be subjected to electroless plating and then performing electroless plating is preferably employed. This method has the advantage that the component for plating according to the present invention is strongly bonded to both the resulting electroless plating film and any component intended to be subjected to electroless plating. Thus, the method can be used in applications such as decorative plating or functional plating. In particular, the component for plating according to the present invention also has heat resistance and has the advantage that an electroless plating film can be strongly bonded even when the surface roughness is small. Therefore, the component for plating according to the present invention can be suitably used for a printed circuit board. In particular, the case where the component for plating according to the present invention is applied to the printed circuit board will be described below.

[Polyimide Resin Contained in Surface a]

Any polyimide resin may be used as a polyimide resin having a siloxane structure according to the present invention as long as the polyamide resin has a siloxane structure. Examples of a method for producing the polyimide resin include (1) a method for producing a polyimide resin by preparing a polyamic acid serving as a precursor of a polyimide resin using an acid dianhydride component having a siloxane structure or a diamine component having a siloxane structure and then imidizing the resulting polyamic acid; (2) a method for producing a polyimide resin by preparing a functional group-containing polyamic acid using a functional group-containing acid dianhydride component or a functional group-containing diamine component, allowing the resulting functional group-containing polyamic acid to react with a compound having a siloxane structure and having a functional group reactive to the functional group contained in the polyamic acid to prepare a polyamic acid having the siloxane structure, and then imidizing the resulting polyamic acid; and (3) a method for producing a polyimide resin having a siloxane structure by preparing a functional group-containing polyamic acid using a functional group-containing acid dianhydride component or a functional group-containing diamine component, imidizing the resulting polyamic acid to prepare a functional group-containing polyimide, and allowing the resulting polyimide to react with a compound having a siloxane structure and having a functional group reactive to the functional group contained in the polyimide. The diamine having a siloxane structure is relatively easily available. Therefore, among these described above, a method for producing a target polyimide resin by reaction of an acid dianhydride component and a diamine having a siloxane structure is preferred. As the diamine having the siloxane structure, a diamine represented by general formula (1):

[Ch. 3]

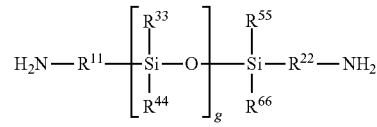

(wherein g represents an integer of 1 or more; $R^{11}$ and $R^{22}$ may be the same or different and each represent an alkylene group or a phenylene group; $R^{33}$ to $R^{66}$ may be the same or different and each represent an alkyl group, a phenyl group, a phenoxy group, or an alkoxy group) is preferably used.

In general formula (1), g represents preferably 1 to 100. Preferably, $R^{11}$ and $R^{22}$ each represent an alkylene group or a phenylene group having 1 to 20 carbon atoms. Preferably, $R^{33}$ to $R^{66}$ each represent an alkyl group, a phenyl group, a phenoxy group, or an alkoxy group having 1 to 20 carbon atoms.

The polyimide resin is obtained by reaction of an acid dianhydride component and a diamine component. The acid dianhydride component will be described below.

Examples of the acid dianhydride component include, but are not limited to, aromatic tetracarboxylic acids, such as pyromellitic dianhydride, 3,3',4,4'-benzophenonetetracarboxylic dianhydride, 3,3',4,4'-diphenyl sulfone tetracarboxylic dianhydride, 1,4,5,8-naphthalenetetracarboxylic dianhydride, 2,3,6,7-naphthalenetetracarboxylic dianhydride, 4,4'-oxydiphthalic anhydride, 3,3',4,4'-dimethyldiphenylsilanetetracarboxylic dianhydride, 1,2,3,4-furantetracarboxylic dianhydride, 4,4'-bis(3,4-dicarboxyphenoxy)diphenylpropanoic dianhydride, 3,3',4,4'-biphenyltetracarboxylic dianhydride, 2,3,3',4'-biphenyltetracarboxylic dianhydride, and p-phenylenediphthalic anhydride; and other compounds, such as 4,4'-hexafluoroisopropylidenediphthalic anhydride, 4,4'-oxydiphthalic anhydride, 3,4'-oxydiphthalic anhydride, 3,3'-oxydiphthalic anhydride, 4,4'-(4,4'-isopropylidenediphenoxy)bis(phthalic anhydride), 4,4'-hydroquinonebis(phthalic anhydride), 2,2-bis(4-hydroxyphenyl)propanedibenzoate-3,3',4,4'-tetracarboxylic dianhydride, 1,2-ethylenebis(trimellitic acid monoester anhydride), and p-phenylenebis(trimellitic acid monoester anhydride). These may be used alone or in combination of two or more.

Subsequently, the diamine component will be described. In the present invention, a diamine component represented by general formula (1):

[Ch. 4]

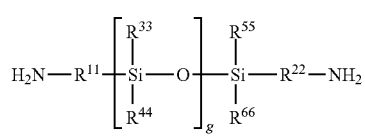

(wherein g represents an integer of 1 or more; $R^{11}$ and $R^{22}$ may be the same or different and each represent an alkylene group or a phenylene group; $R^{33}$ to $R^{66}$ may be the same or different and each represent an alkyl group, a phenyl group, a phenoxy group, or an alkoxy group) is preferably contained in the diamine component.

In general formula (1), g represents preferably 1 to 100. Preferably, $R^{11}$ and $R^{22}$ each represent an alkylene group or a phenylene group having 1 to 20 carbon atoms. Preferably, $R^{33}$ to $R^{66}$ each represent an alkyl group, a phenyl group, a phenoxy group, or an alkoxy group having 1 to 20 carbon atoms.

By using the diamine component represented by general formula (1), the resulting polyimide resin can strongly adhere to an electroless plating film.

Examples of the diamine represented by general formula (1) include 1,1,3,3-tetramethyl-1,3-bis(4-aminophenyl)disiloxane, 1,1,3,3-tetraphenoxy-1,3-bis(4-aminoethyl)disiloxane, 1,1,3,3,5,5-hexamethyl-1,5-bis(4-aminophenyl)trisiloxane, 1,1,3,3-tetraphenyl-1,3-bis(2-aminophenyl)disiloxane, 1,1,3,3-tetraphenyl-1,3-bis(3-aminopropyl)disiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(3-aminobutyl)trisiloxane, 1,1,5,5-tetraphenyl-3,3-dimethoxy-1,5-bis(3-aminopentyl)trisiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(4-aminobutyl)disiloxane, 1,3-dimethyl-1,3-dimethoxy-1,3-bis(4-aminobutyl)disiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane, and 1,1,3,3,5,5-hexapropyl-1,5-bis(3-aminopropyl)trisiloxane. Examples of the relatively easily available diamine represented by general formula (1) include KF-8010, X-22-161A, X-22-161B, X-22-1660B-3, KF-8008, KF-8012, and X-22-9362 manufactured by Shin-Etsu Chemical Co., Ltd. These diamines may be used alone or as a mixture of two or more.

To improve the heat resistance and the like of the surface a, the above-described diamine may be preferably used in combination with other diamine. As the other diamine, any diamine may be usable. Examples thereof include m-phenylenediamine, o-phenylenediamine, p-phenylenediamine, m-aminobenzylamine, p-aminobenzylamine, bis(3-aminophenyl) sulfide, (3-aminophenyl) (4-aminophenyl) sulfide, bis(4-aminophenyl) sulfide, bis(3-aminophenyl) sulfoxide, (3-aminophenyl) (4-aminophenyl) sulfoxide, bis(3-aminophenyl) sulfone, (3-aminophenyl) (4-aminophenyl) sulfone, bis(4-aminophenyl) sulfone, 3,4'-diaminobenzophenone, 4,4'-diaminobenzophenone, 3,3'-diaminodiphenylmethane, 3,4'-diaminodiphenylmethane, 4,4'-diaminodiphenylmethane, 4,4'-diaminodiphenyl ether, 3,3'-diaminodiphenyl ether, 3,4'-diaminodiphenyl ether, bis[4-(3-aminophenoxy)phenyl]sulfoxide, bis[4-(aminophenoxy)phenyl]sulfoxide, 4,4'-diaminodiphenyl ether, 3,4'-diaminodiphenyl ether, 3,3'-diaminodiphenyl ether, 4,4'-diaminodiphenyl thioether, 3,4'-diaminodiphenyl thioether, 3,3'-diaminodiphenyl thioether, 3,3'-diaminodiphenylmethane, 3,4'-diaminodiphenylmethane, 4,4'-diaminodiphenylmethane, 4,4'-diaminodiphenyl sulfone, 3,4'-diaminodiphenyl sulfone, 3,3'-diaminodiphenyl sulfone, 4,4'-diaminobenzanilide, 3,4'-diaminobenzanilide, 3,3'-diaminobenzanilide, 4,4'-diaminobenzophenone, 3,4'-diaminobenzophenone, 3,3'-diaminobenzophenone, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,4-bis(3-aminophenoxy)benzene, 1,4'-bis(4-aminophenoxy)benzene, 4,4'-bis(4-aminophenoxy)biphenyl, bis[4-(3-aminophenoxy)phenyl] ketone, bis[4-(4-aminophenoxy)phenyl] ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, bis[4-{4-(4-aminophenoxy)phenoxy}phenyl] sulfone, 1,4-bis[4-(4-aminophenoxy)-α,α-dimethylbenzyl]benzene, 1,3-bis[4-(4-aminophenoxy)-α,α-dimethylbenzyl]benzene, and 3,3'-dihydroxy-4,4'-diaminobiphenyl.

The content of the diamine represented by general formula (1) is preferably 2 to 100 mole percent and more preferably 5 to 100 mole percent relative to the total amount of the diamine components. When the amount of the diamine represented by general formula (1) is less than 2 mole percent relative to the total amount of the diamine components, the adhesion strength between the surface a and the electroless plating film may be reduced.

The polyimide is prepared by cyclodehydration of the corresponding precursor, i.e., polyamic acid polymer. The polyamic acid polymer is prepared by reaction of substantially equimolar amounts of an acid dianhydride component and a diamine component.

A typical procedure of the reaction includes dissolving or dispersing at least one diamine component in a polar organic solvent and then adding at least one acid dianhydride component to prepare a polyamic acid solution. The order of the addition of each monomer is not particularly limited. The polyamic acid polymer solution may be prepared by adding an acid dianhydride component into a polar organic solvent and then adding a diamine component thereto. Alternatively, the polyamic acid solution may be prepared by adding a predetermined amount of the diamine component into the polar organic solvent in advance, adding an excessive amount of the acid dianhydride thereto, and then adding the diamine in an amount equivalent to the excessive amount. In addition to these processes, various addition processes known to those skilled in the art may be employed. Specific examples thereof include as follows.

Here, the term "dissolution" includes not only the state of the complete dissolution of a solute in a solvent but also the state of the uniform dispersion, which is substantially identical to the state of dissolution, of a solute in a solvent. The reaction time and the reaction temperature are not particularly limited.

(1) a process of dissolving a diamine component in a polar organic solvent and allowing the resulting solution to react with a substantially equimolar amount of an acid dianhydride component;
(2) a process of allowing an acid dianhydride component to react with fewer moles of a diamine component in a polar organic solvent to prepare a prepolymer having acid anhydride groups at the both ends and then polymerizing the prepolymer with a diamine component in a manner such that the acid dianhydride component and the diamine component are substantially equimolar in the whole process;
(3) a process of allowing an acid dianhydride component to react with excess moles of diamine component in a polar organic solvent to prepare a prepolymer having amino groups at the both ends, adding an additional diamine component to the prepolymer, and then polymerizing the prepolymer with an acid dianhydride component in a manner such that the acid dianhydride component and the diamine component are equimolar in the whole process;
(4) a process of dissolving an acid dianhydride component in a polar organic solvent and then polymerizing the acid dianhydride component with a substantially equimolar amount of a diamine component; and
(5) a process of performing polymerization by reaction of a mixture containing substantially equimolar amounts of an acid dianhydride component and a diamine component in a polar organic solvent.

Examples of the polar organic solvent used for polymerization reaction of the polyamic acid include sulfoxide solvents, such as dimethyl sulfoxide and diethyl sulfoxide; formamide solvents, such as N,N-dimethylformamide and N,N-diethylformamide; acetamide solvents, such as N,N-dimethylacetamide and N,N-diethylacetamide; pyrrolidone solvents, such as N-methyl-2-pyrrolidone and N-vinyl-2-pyrrolidinone; phenol solvents, such as phenol, o-, m-, or p-cresol, xylenol, halogenized phenol, and catechol; and other compounds, such as hexamethylphosphoramide and γ-butyrolactone. Furthermore, if necessary, these polar organic solvents may be used in combination with an aromatic carbon hydride, such as xylene or toluene.

A polyimide is prepared by performing thermal or chemical cyclodehydration of the polyamic acid in a polyamic acid solution prepared by the above-described process. A thermal method for performing dehydration by heating the polyamic acid solution or a chemical method for performing dehydration with a dehydrator may be employed. Alternatively, a method for performing imidization by heating under reduced pressure may be employed. These methods will be described below.

An example of the thermal cyclodehydration is a method in which imidization proceeds simultaneously with evaporation of the solvent by heating the polyamic acid solution. This method can provide a solid polyimide resin. Heating conditions are not particularly limited, but heating is preferably performed at 200° C. or less in the range of 1 second to 200 minutes.

An example of the chemical cyclodehydration is a method of adding a catalyst and a stoichiometrically excessive amount of a dehydrator to the polyamic acid solution to initiate a dehydration reaction and then evaporating the solvent. Thereby, a solid polyimide resin can be obtained. Examples of the dehydrator include aliphatic acid anhydrides such as acetic anhydride; and aromatic acid anhydrides such as benzoic anhydride. Examples of the catalyst include aliphatic tertiary amines such as triethylamine; aromatic tertiary amines such as dimethylaniline; and heterocyclic tertiary amines, such as pyridine, α-picoline, β-picoline, γ-picoline, and isoquinoline. With respect to the conditions of the chemical cyclodehydration, the temperature is preferably 100° C. or less. The organic solvent is preferably evaporated at 200° C. or less in the range of about 5 to 120 minutes.

Furthermore, as another method for producing a polyimide resin, in the above-described thermal or chemical cyclodehydration methods, a method not including evaporating the solvent may be employed. Specifically, the method includes feeding a polyimide solution prepared by thermal imidization or chemical imidization with a dehydrator into a poor solvent to precipitate a polyimide resin, purifying the precipitated resin by removing an unreacted monomer, and drying the residue to prepare a solid polyimide resin. A poor solvent satisfactorily miscible with the solvent but having low dissolving ability for the polyimide is selected. Examples of the poor solvent include, but are not limited to, acetone, methanol, ethanol, isopropanol, benzene, methyl cellosolve, and methyl ethyl ketone.

With respect to the method of imidization by heating under reduced pressure, this imidization method can advantageously remove water generated by imidization from the system and can thus hydrolysis of the polyamic acid can be suppressed, thereby resulting in a polyimide having a high-molecular weight. Furthermore, by employing this method, a compound having an open-circular structure at an end or having open-circular structure at both ends cyclizes again, the compound being present as an impurity in an acid dianhydride that is used as a starting material. Therefore, the effect of further increasing the molecular weight can be expected.

The temperature in the method of imidization under reduced pressure, the temperature is preferably 80° C. to 400° C. The temperature is more preferably 100° C. or more and still more preferably 120° C. or more because imidization is efficiently performed and water is also efficiently removed. The maximum temperature is preferably up to the thermal decomposition temperature of the target polyimide and is usually set at a temperature in which normal imidization is completed. That is, the maximum temperature is set at about 150° C. to 350° C.

With respect to the reduced pressure, a lower pressure is preferable. Specifically, the pressure is set at $9 \times 10^4$ to $1 \times 10^2$ Pa, preferably $8 \times 10^4$ to $1 \times 10^2$ Pa, and more preferably $7 \times 10^4$ to $1 \times 10^2$ Pa.

The polyimide resin has been described as the above. A commercially available polyimide resin having a siloxane structure may be used. Examples of the relatively easily available polyimide resin having a siloxane structure and capable of being used for forming the surface a of a laminate according to the present invention include X-22-8917, X-22-8904, X-22-8951, X-22-8956, X-22-8984, and X-22-8985, which are manufactured by Shin-Etsu Chemical Co., Ltd., and are polyimide solutions.

The polyimide resin having a siloxane structure and constituting the layer A in the present invention is preferably composed of a thermoplastic polyimide from the standpoint of satisfactory adhesion to an electroless plating film. Here, the term "thermoplastic polyimide" in the present invention means a polyimide that undergoes permanent compressive deformation when the polyimide is analyzed by thermomechanical analysis (TMA) in a compression mode (probe diameter: 3 mm, load: 5 g) in the temperature range of 10° C. to 400° C. (heating rate: 10° C./min).

[Layer A Having Surface a]

A layer having the surface a always contains the above-described polyimide resin having a siloxane structure, but may further contain another component. Examples of the other component that can be appropriately used include resins, such as thermoplastic resins and thermosetting resins. This incorporation can improve heat resistance without deterioration of adhesion to an electroless plating film. In particular, use of the thermosetting resin advantageously improves not only the heat resistance of the layer A but also the adhesion to a layer B and a polymeric film C, and is thus preferable. The content of the thermosetting resin is preferably 3 to 100 parts by weight relative to 100 parts by weight of the polyimide resin having a siloxane structure in view of achieving a balance between characteristics such as heat resistance and adhesion.

Examples of the thermoplastic resins include polysulfone resins, polyethersulfone resins, polyphenylene ether resins, phenoxy resins, and thermoplastic polyimide resins each having a structure different from that prepared by reaction of an acid dianhydride component and an amine component containing a diamine represented by general formula (1). These may be used alone or in appropriate combination.

Examples of the thermosetting resins include bismaleimide resins, bisallylnadiimide resins, phenol resins, cyanate resins, epoxy resins, acrylic resins, methacrylic resins, triazine resins, curable hydrosilyl resins, curable allyl resin, and unsaturated-polyester resins. These may be used alone or in appropriate combination. In addition to these thermosetting resins, reactive side-chain group-containing thermosetting polymers each having a reactive group, such as an epoxy group, an allyl group, a vinyl group, an alkoxysilyl group, or a hydrosilyl group in the side chain or a terminus of the polymeric molecular chain may be used.

For the purpose of improving adhesion between the surface a and an electroless plating film, various additives may be present by addition to a polymeric material or by application on the surface of a polymeric material. Specific examples of the additives include, but are not limited to, organic thiol compounds.

Furthermore, to improve adhesion between the surface a and the electroless plating film by roughening the surface of the surface a to the extent that the formation of a fine-pitch circuit is not impaired, various organic or inorganic fillers may be incorporated.

Note that it is important to combine the above-described other components in such a manner that the surface roughness of the surface a is not increased to the extent that the formation of a fine-pitch circuit is adversely affected and in such a manner that adhesion between the surface a and the electroless plating film is not impaired.

The content of the polyimide resin having a siloxane structure contained in the surface a is preferably in the range of 30 to 100 percent by weight from the standpoint of a satisfactory balance between surface roughness and adhesion to the electroless plating film.

The term "surface a" in the present invention means a surface having a thickness of 10 Å or more.

The surface a in the present invention advantageously has high adhesion strength to the electroless plating film even when the surface roughness is small. The term "surface roughness" used in the present invention can be expressed in terms of arithmetic average roughness Ra measured with a cutoff value of 0.002 mm. Arithmetic average roughness Ra is defined by JIS B 0601 (revised version published in Feb. 1, 1994). In particular, the value of arithmetic average roughness Ra in the present invention is a value determined by the observation of the surface with an optical-interferometric surface-structure analyzer. The term "cutoff value" in the present invention is described in JIS B 0601 and means a wavelength set in determining a roughness curve from a profile curve (actually measured data). That is, the value of Ra measured with a cutoff value of 0.002 mm means the value of arithmetic average roughness calculated from a roughness curve obtained by removing irregularities having wavelengths more than 0.002 mm from actually measured data.

The surface roughness of the surface a in the present invention is preferably less than 0.5 μm in terms of arithmetic average roughness Ra measured with a cutoff value of 0.002 mm. Consequently, the surface a in the present invention has a very smooth surface when the roughness of a minute area is observed. Therefore, for example, even when a fine-pitch circuit having a line and space resolution of 10 μm/10 μm or less is formed, the surface a does not adversely affect.

As long as this requirement is satisfied, in particular, when the component for plating according to the present invention is used for a printed circuit board, a satisfactory fine-pitch circuit can be formed. To form the layer A having such a surface, for example, the following methods should be appropriately combined:

(1) surface treatment is not performed;

(2) the surface roughness of the surface of a support or a slip sheet is appropriately selected, the surface being brought into contact with the layer A for electroless plating;

(3) in the case of a sheet including at least two layers containing the layer A having the surface a for electroless plating, the surface roughness of a layer being in contact with the layer A is appropriately selected; and (4) the composition of a polyimide resin contained in the layer A and drying conditions in forming the layer A are appropriately selected.

Specifically, physical surface roughening such as sand-blasting and chemical surface roughening, in which, for example, an alkaline-soluble component is incorporated and treatment with an alkaline solution is performed, are preferably not performed.

In the case of a sheet in which the component for plating according to the present invention is provided on a support, the surface roughness of the support is preferably adequately small. Furthermore, when the sheet is laminated with an inner circuit board, the surface roughness of a slip paper facing the sheet in lamination is preferably adequately small. Thus, the surface roughness of the support or the slip paper is preferably 0.5 μm or less in terms of arithmetic average roughness measure with a cutoff value of 0.002 mm.

In the case of a sheet including at least two layers containing the layer A having the surface a for electroless plating, since the surface roughness of a layer being in contact with the layer A may affect the surface of the layer A, the surface roughness of the layer being in contact with the layer A is preferably adequately small. Thus, the surface roughness of the layer being in contact with the layer A is preferably 0.5 μm or less in terms of arithmetic average roughness measured with a cutoff value of 0.002 mm.

The surface roughness of the surface a for electroless plating varies depending on the compounding ratio and the types of an acid dianhydride component and a diamine component that are used for preparing a polyimide resin having a siloxane structure. For example, when a large amount of a siloxane bond-containing diamine is used, phase separation may occur to increase Ra depending on the type of the acid dianhydride component or other diamine component combined. When a siloxane bond-containing polyimide resin is mixed with a thermoplastic polyimide resin, phase separation tends to occur, thereby increasing Ra. Furthermore, drying conditions and the like are considered. The surface roughness of the inventive surface a for electroless plating is small in a minute area and thus varies depending on the composition of the polyimide resin having a siloxane structure contained in the layer A and drying conditions of the layer A. Therefore, whether a target surface roughness is obtained or not should be confirmed by variously changing the composition of the polyimide resin and the drying conditions of the layer A.

Also, incorporation of the other component may cause phase separation to increase Ra depending on the content of the other component and the combination of resins. Thus, whether a target surface roughness is obtained or not should be confirmed by variously changing the content of the other component and the resins.

In the component for plating or the insulating sheet according to the present invention, alkaline treatment, such as desmearing, is performed before forming a film by electroless plating, in some cases. For example, the surface of a component composed of a known epoxy resin is roughened by the alkaline treatment such as desmearing. However, in the surface a for electroless plating according to the present invention, since the polyimide resin having a siloxane structure is present at the surface a, the smooth surface is not roughened but maintained even when the alkaline treatment, such as desmearing, is performed. Furthermore, the electroless plating film is strongly bonded.

[Single-Layer Sheet Having Surface a]

A single-layer sheet containing a surface a for electroless plating and a polyimide resin having a siloxane structure will be described. For example, a solution for forming the surface a for electroless plating is flow-cast on a support and then dried to produce a sheet having the surface a. By laminating this sheet on a desired component, for example, an inner circuit board or a polymeric film, the surface a can be provided. When a solution containing a polyimide resin is used as the solution for forming the surface a, the solution is flow-cast on a support and then dried with a hot-air oven or the like. The drying conditions are not particularly limited. Drying is preferably performed under conditions such that a solvent dissolving the resin adequately evaporates. Furthermore, to prevent foaming of the sheet, drying may be performed with stepwise changes in temperature.

When a solution containing a polyamic acid is used as the solution for forming the surface a, the solution is flow-cast on a support and then dried with a hot-air oven or the like. In this case, to achieve good production efficiency, imidization is preferably performed while drying. Thus, drying and imidization are preferably performed at an ultimate temperature of 150° C. to 400° C.

The single-layer sheet preferably has a thickness of 2 to 100 μm from the standpoint of adhesion to the electroless plating film and circuit-embedding properties.

[Insulating Sheet Including at Least Two Layers Containing Layer A Having Surface a]

To impart desired characteristics to the insulating sheet, the structure of the insulating sheet including at least two layers containing the layer A having the surface a according to the present invention may be modified. Specific examples of the insulating sheet include the following:

(1) an insulating sheet including one outermost layer composed of the layer A having the surface a for electroless plating and another outermost layer composed of a layer B for facing a circuit separately provided;
(2) an insulating sheet including the layer A having the surface a for electroless plating/a polymeric film layer C/a layer B for facing a circuit separately provided;
(3) an insulating sheet including the layer A having the surface a for electroless plating/a polymeric film; and
(4) an insulating sheet including the layer A having the surface a for electroless plating/a polymeric film/the layer A' having the surface a' for electroless plating.

(1) Insulating Sheet Including One Outermost Layer Composed of Layer A Having Surface a for Electroless Plating and Another Outermost Layer Composed of Layer B for Facing Circuit Separately Provided This insulating sheet includes one outermost layer A for electroless plating to form a film and another outermost layer B for facing a circuit provided. The outermost layer A contains a polyimide resin having a siloxane structure.

The outermost layer A, i.e., the layer for forming a metal layer, is composed of the polyimide resin having a siloxane structure. Thus, adhesion strength to the metal layer is high even when the surface roughness is small. By providing the outermost layer B for facing the circuit provided, it is possible to obtain an insulating sheet having not only satisfactory processability (for example, bondability between the insulating sheet according to the present invention and an inner circuit board under low-temperature and low-pressure conditions, and the ability of filling gaps between lines in the circuit with the insulating sheet) but also low linear expansivity. The outermost layer B containing a thermosetting resin is an insulating layer having satisfactory processability and is thus preferable. In particular, the outermost layer B containing a thermoplastic polyimide resin and a thermosetting resin is an insulating layer having satisfactory electrical properties, such as dielectric properties, and heat resistance in addition to satisfactory processability, and is thus preferable.

In the present invention, it is possible to obtain an insulating sheet having well-balanced characteristics by separating the functions of the layer A for forming a metal layer from those of the layer B for facing a circuit provided. On the other hand, for example, when an insulating sheet consisting of only the layer A containing a polyimide having a siloxane structure is used, it is possible to form a fine-pitch circuit because a metal layer is strongly bonded. However, if this insulating sheet is directly applied to a build-up circuit board or the like, circuit-embedding properties and linear expansivity are insufficient. For example, when an insulating sheet consisting of only the layer B is used, circuit-embedding properties and linear expansivity are satisfactory. However, it is impossible to form a fine-pitch circuit because of poor adhesion to a metal layer.

In view of achieving a balance between circuit-embedding properties and low linear expansivity, suitable melt viscosity and linear expansivity of the layer B are present. That is, the melt viscosity of the B-stage layer B is preferably 20,000 Pa·s or less, more preferably 15,000 Pa·s or less, and most preferably 10,000 Pa·s or less. The linear expansivity of the layer B is preferably 100 ppm or less, more preferably 80 ppm or less, and most preferably 60 ppm or less.

This insulating sheet has satisfactory adhesion to an electroless plating film and thus can be applied to a semi-additive process capable of forming a fine-pitch circuit.

Furthermore, the insulating sheet has high adhesion strength not only in normal state but also after an environmental test, such as a pressure cooker test (PCT), and has thus high reliability.

In the insulating sheet according to the present invention, the structure consisting of the outermost layer A/the outermost layer B is the simplest structure and is thus preferable, but other layer may be provided between the outermost layer A and the outermost layer B. Two or more other layers may be provided, if necessary. An example of such an insulating sheet will be described.

(Outermost Layer A)

The same layer as that described in section (layer A having surface a) can be used.

(Outermost Layer B)

A component used for the outermost layer B according to the present invention will be described in detail. In laminating the insulating sheet according to the present invention on an uneven surface including a circuit, the outermost layer B is required to have satisfactory processability such that the outermost layer B flows into gaps between lines in the circuit to fill in the gap. The outermost layer B according to the present invention preferably contains a thermosetting resin because of the satisfactory processability of the thermosetting resin. Examples of the thermosetting resin available include thermosetting resins, such as epoxy resins, phenol resins, thermosetting polyimide resins, cyanate ester resins, curable hydrosilyl resins, bismaleimide resins, bisallylnadiimide resins, acrylic resins, methacrylic resins, allyl resins, and unsaturated-polyester resins; and reactive side-chain group-containing thermosetting polymers each having a reactive group, such as an allyl group, a vinyl group, an alkoxysilyl group, or a hydrosilyl group, in the side chain or the terminus of the polymeric molecular chain. A thermosetting resin composition containing the thermosetting resin in combination with an appropriate thermal curing agent and curing catalyst is available for the outermost layer B. Among the thermosetting resins, the outermost layer B preferably contains an epoxy resin having a good balance between heat resistance and processability. Any epoxy resin can be used as the epoxy resin according to the present invention. Examples of the epoxy resin usable include bisphenol-type epoxy resins, halogenated bisphenol-type epoxy resins, phenol novolac-type epoxy resins, halogenated phenol novolac-type epoxy resins, alkylphenol novolac-type epoxy resins, polyphenol-type epoxy resins, polyglycol-type epoxy resins, alicyclic epoxy resins, cresol novolac-type epoxy resins, glycidylamine-type epoxy resins, urethane-modified epoxy resins, rubber-modified epoxy resins, and epoxy-modified polysiloxanes. Furthermore, to improve, for example, the toughness of the outermost layer B, a thermoplastic resin, such as a phenoxy resin or a thermoplastic polyimide resin, or the like is preferably incorporated.

In particular, use of a thermosetting resin composition containing an epoxy resin, having well-balanced characteristics required for a material used in a printed circuit board, and a thermoplastic polyimide resin not only achieves satisfactory characteristics, such as circuit-embedding properties, but also improves adhesion to an inner circuit substrate, and is thus preferable. Furthermore, the layer B composed of the thermosetting resin composition is also strongly bonded to the layer A and is thus preferable.

The thermoplastic polyimide resin will be specifically described. The term "thermoplastic polyimide" in the present invention means a polyimide that undergoes permanent compressive deformation when the polyimide is analyzed by thermomechanical analysis (TMA) in a compression mode (probe diameter: 3 mm, load: 5 g) in the range of 10° C. to 400° C. (heating rate: 10° C./min). Any thermoplastic polyimide resin may be used as the thermoplastic polyimide resin used for the layer B according to the present invention as long as the above-described criteria are satisfied. From the standpoint of adhesion to an inner circuit substrate and adhesion to the layer A, the acid dianhydride component contains an acid dianhydride represented by general formula (2):

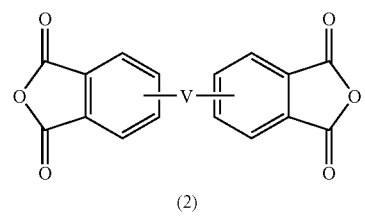

[Ch. 5]

(2)

(wherein V represents —O— or —O-T-O—, and T represents a divalent organic group). Among these, in particular, at least one acid dianhydride selected from the group consisting of the acid dianhydrides represented by general formula (2) is preferably used, wherein T is selected from the group consisting of

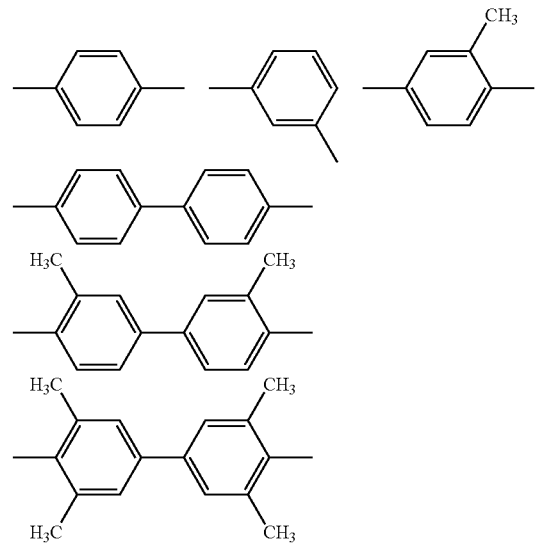

[Ch. 6]

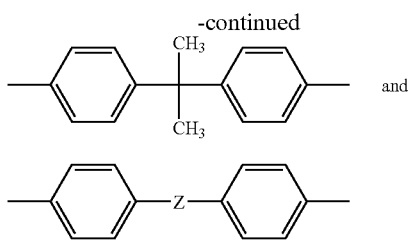

(wherein Z represents a divalent group selected from the group consisting of —C$_Q$H$_{2Q}$—, —C(=O)—, —SO$_2$—, —O—, and —S—, and Q represents an integer of 1 to 5). From the standpoint of, for example, a good balance between characteristics, such as adhesion to the layer A and compatibility with the thermosetting component, 4,4'-(4,4'-isopropylidenediphenoxy)bis(phthalic anhydride) is particularly preferably used, wherein general formula (2) is represented by the following structure:

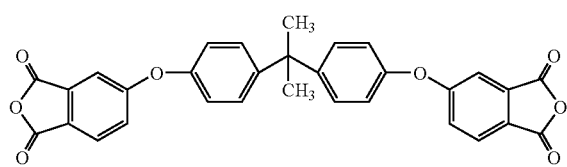

The acid dianhydride represented by general formula (2) is preferably used in an amount of 50 mole percent or more for the total amount of the acid dianhydride component.

Examples of an acid dianhydride other than the acid dianhydride represented by general formula (2) include, but are not limited to, pyromellitic dianhydride, 3,3',4,4'-benzophenonetetracarboxylic dianhydride, 3,3',4,4'-diphenyl sulfone tetracarboxylic dianhydride, 1,4,5,8-naphthalenetetracarboxylic dianhydride, 2,3,6,7-naphthalenetetracarboxylic dianhydride, 4,4'-oxydiphthalic anhydride, 3,3',4,4'-dimethyldiphenylsilanetetracarboxylic dianhydride, 1,2,3,4-furantetracarboxylic dianhydride, 4,4'-bis(3,4-dicarboxyphenoxy)diphenylpropanoic dianhydride, 4,4'-hexafluoroisopropylidenediphthalic anhydride, 3,3',4,4'-biphenyltetracarboxylic dianhydride, 2,3,3',4'-biphenyltetracarboxylic dianhydride, p-phenylenediphthalic anhydride, p-phenylenebis(trimellitic anhydride), 2,2'-bis(hydroxyphenyl)propane dibenzoate tetracarboxylic dianhydride, 3,3',4,4'-ethylene glycol dibenzoate tetracarboxylic dianhydride, and 2,2-bis(3,4-dicarboxyphenyl)-1,1,1,3,3,3-hexafluoromethyl dianhydride.

The polyimide resin used in the present invention is preferably a polyimide resin prepared using at least one diamine represented by general formula (3):

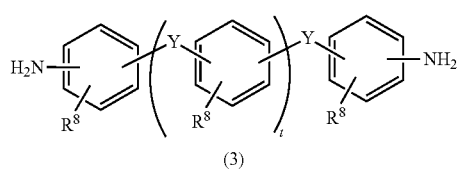

(wherein Y represents —C(=O)—, —SO$_2$—, —O—, —S—, —(CH$_2$)$_m$—, —NHCO—, —C(CH$_3$)$_2$—, —C(CF$_3$)$_2$—, —C(=O)O—, or a bond, m and n each represent an integer of 1 to 5, t represents an integer of 1 to 10, and R8s are each independent and they represent at least one group selected from the group consisting of a hydrocarbon group, such as a methyl group and an ethyl group, a halogen group, such as a bromo group and a chloro group, a hydroxyl group, a carboxyl group, and cyano group). These diamine compounds may be used alone or in combination with two or more. Here, in formula (3), a plurality of Ys may be the same or different in repeating units. A hydrocarbon group, such as a methyl group or an ethyl group, or a halogen group, such as Br or Cl, may be introduced to each benzene ring. Examples of the diamine compound represented by general formula (3) include bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,4-bis(3-aminophenoxy)benzene, 1,4'-bis(4-aminophenoxy)benzene, 4,4'-bis(4-aminophenoxy)biphenyl, bis[4-(3-aminophenoxy)phenyl] ketone, bis[4-(4-aminophenoxy)phenyl] ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, bis[4-{4-(4-aminophenoxy)phenoxy}phenyl] sulfone, 1,4-bis[4-(4-aminophenoxy)-α,α-dimethylbenzyl]benzene, and 1,3-bis[4-(4-aminophenoxy)-α,α-dimethylbenzyl]benzene.

Furthermore, among the diamine compounds represented by general formula (3), a diamine compound having amino groups at the meta-positions, i.e., a diamine compound represented by general formula (4):

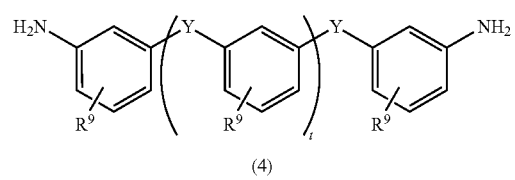

(wherein Ys each represent —C(=O)—, —SO$_2$—, —O—, —S—, —(CH$_2$)$_m$—, —NHCO—, —C(CH$_3$)$_2$—, —C(CF$_3$)$_2$—, —C(=O)O—, or a bond, m and n each represent an integer of 1 to 5, t represents an integer of 1 to 10, R$^9$s are each independent and each represent at least one group selected from the group consisting of a hydrocarbon group, such as a methyl group and an ethyl group, a halogen group, such as a bromo group and a chloro group, a hydroxyl group, a carboxyl group, and a cyano group) provides a thermoplastic polyimide resin having solubility better than that of a diamine compound having amino groups at the para-positions and is thus preferable.

Examples of the diamine compound represented by general formula (4) include 1,1-bis[4-(3-aminophenoxy)phenyl]ethane, 1,2-bis[4-(3-aminophenoxy)phenyl]ethane, 2,2-bis[4-(3-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 1,3-bis(3-aminophenoxy)benzene, 1,4-bis(3-aminophenoxy)benzene, bis[4-(3-aminophenoxy)phenyl] ketone, bis[4-(3-aminophenoxy)phenyl]sulfide, bis[4-(3-aminophenoxy)phenyl]sulfone, bis[4-(3-aminophenoxy)phenyl]ether, 1,4-bis[4-(3-aminophenoxy)benzoyl]benzene, 1,3-bis[4-(3-aminophenoxy)benzoyl]benzene, and 4,4'-bis[3-(3-aminophenoxy)benzoyl]diphenyl ether.

Among these diamine compounds, 1,3-bis(3-aminophenoxy)benzene is preferably used from the standpoint of adhesion to the layer A and solubility of the resulting resin.

Also, a polyimide resin prepared by using a diamine having a hydroxyl group and/or a carboxyl group is preferable. The polyimide resin prepared by using the diamine having a hydroxyl group and/or a carboxyl group contains a hydroxyl group and/or a carboxyl group and can thus react with an epoxy resin or the like. Therefore, the polyimide resin can be crosslinked via the epoxy resin, and a resin composition having satisfactory heat resistance can be produced.

The diamine having a hydroxyl group and/or a carboxyl group is not particularly limited as long as the diamine has a hydroxyl group and/or a carboxyl group. Examples thereof include diaminobenzoic acids, 3,3'-dihydroxy-4,4'-diaminobiphenyl, 4,3'-dihydroxybiphenyl-3,4'-diamine, 2,2'-diaminobisphenol A, and 5,5'-methylene-bis(anthranilic acid).

Examples of other diamine components usable include, but are not limited to, m-phenylenediamine, o-phenylenediamine, p-phenylenediamine, m-aminobenzylamine, p-aminobenzylamine, bis(3-aminophenyl) sulfide, (3-aminophenyl) (4-aminophenyl) sulfide, bis(4-aminophenyl) sulfide, bis (3-aminophenyl) sulfoxide, (3-aminophenyl) (4-aminophenyl) sulfoxide, bis(3-aminophenyl) sulfone, (3-aminophenyl) (4-aminophenyl) sulfone, bis(4-aminophenyl) sulfone, 3,4'-diaminobenzophenone, 4,4'-diaminobenzophenone, 3,3'-diaminodiphenylmethane, 3,4'-diaminodiphenylmethane, 4,4'-diaminodiphenylmethane, 4,4'-diaminodiphenyl ether, 3,3'-diaminodiphenyl ether, 3,4'-diaminodiphenyl ether, bis[4-(3-aminophenoxy)phenyl] sulfoxide, and bis[4-(aminophenoxy)phenyl] sulfoxide.

The thermoplastic polyimide resin used in the layer B can be produced by the same process as that employed for the layer A.

Furthermore, the layer B according to the present invention can contain a commercially available thermoplastic polyimide resin. Examples thereof include ULTEM 1000-1000 and ULTEM 1010-1000 (both manufactured by General Electric Company).

The resin used for the layer B according to the present invention has been described as above. To achieve low linear expansivity, it is possible to combine various fillers.

(Other Layer)

In (1) the insulating sheet including one outermost layer composed of the layer A having the surface a for electroless plating and the other outermost layer composed of the layer B for facing a circuit separately provided, since the structure consisting of the outermost layer A/the outermost layer B is the simplest structure, the structure consisting of the outermost layer A/the outermost layer B has been mainly described. To achieve low linear expansivity or the like, other layer may be provided between the outermost layer A and the outermost layer B. Two or more other layers may be provided, if necessary. An insulating sheet including the other layer composed of a polymeric film will be described in the following section (2).

(2) Insulating Sheet Including Layer A Having Surface a for Electroless Plating/Polymeric Film Layer C/Layer B for Facing Circuit Separately Provided This insulating sheet includes the layer A having the surface a for electroless plating and the layer B for facing a circuit separately provided, the layer A being provided on one side of a polymeric film layer C, the layer B being provided on the other side.

That is, it is possible to obtain an insulating sheet having satisfactory processability, for example, high adhesion to a metal layer, by providing a thermoplastic polyimide resin having a predetermined structure in the layer A for forming a metal layer even when the surface roughness is small. It is also possible to obtain an insulating sheet having satisfactory processability, such as good bondability between the insulating sheet according to the present invention and an inner circuit board under low-temperature and low-pressure conditions and the ability of filling in gaps between lines in the circuit by providing the layer B serving as a layer for facing a circuit provided.

This insulating sheet has the polymeric film layer C and thus has satisfactory low linear expansivity, and it is possible to maintain a uniform thickness of the insulating layer even after lamination with the inner circuit board.

Furthermore, the insulating sheet has high adhesion strength not only in normal state but also after an environmental test, such as a pressure cooker test (PCT), and thus has high reliability.

The insulating sheet according to the present invention preferably has a layer A/layer C/layer B structure, which is the simplest structure. However, each of the layers may have a multilayer structure.

An example of preparation of the insulating sheet will be described.

(Outermost Layer A)

The same layer as that described in section (Layer A having surface a) can be used.

(Outermost Layer B)

The same layer as that described in subsection (Outermost layer B) in section "(1) Insulating sheet including one outermost layer composed of layer A having surface a for electroless plating and the another outermost layer composed of layer B for facing circuit separately provided" can be used.

(Polymeric Film Layer C)

The polymeric film will be described below. In the insulating sheet having a layer A having the surface a for electroless plating/polymeric film layer C/layer B for facing a circuit separately provided structure, the polymeric film is used for achieving low linear expansivity. The linear expansion coefficient of an insulating sheet having a layer A/polymeric film layer C structure can be controlled by adjusting a balance between the linear expansion coefficient and thickness of the polymeric film layer C and those of the layer A. The linear expansion coefficient of an insulating sheet having a layer A/polymeric film layer C/layer A' structure can be controlled by adjusting a balance between the linear expansion coefficient and thickness of the polymeric film layer C and those of the layers A and A'. The linear expansion coefficient of each of these laminates is preferably in the range of 2 to 60 ppm and more preferably 5 to 30 ppm. As a method for controlling the linear expansion coefficient of these insulating sheets, a method of reducing the linear expansion coefficient of the polymeric film is easy and is thus preferable.

Furthermore, when a laminate according to the present invention is used as a flexible printed circuit board, dimensional stability is required.

Therefore, a polymeric film preferably has a linear expansion coefficient of 20 ppm or less. Furthermore, the polymeric film preferably has low water absorption coefficient so that a defect, such as swelling, due to heat in processing does not occur. To form a small-diameter via hole, the thickness of the polymeric film is preferably 50 µm or less, more preferably 35 µm or less, and still more preferably 25 µm or less. In addition, the thickness of the polymeric film is preferably 1 µm or more and more preferably 2 µm or more. It is preferred that the polymeric film be not very thick and ensure sufficient electrical insulation.

The polymeric film used in the present invention most preferably has low linear expansivity, high heat resistance, low water absorption coefficient, and satisfactory mechanical properties. Such a polymeric film may have a single-layer structure or a structure having at least two layers. Examples of the material of the polymeric film having the single-layer structure include polyolefins, such as polyethylene, polypropylene, and polybutene; polyesters, such as ethylene-vinyl alcohol copolymers, polystyrene, poly(ethylene terephthalates), poly(butylene terephthalate), and ethylene-2,6-naphthalate; and other compounds, such as nylon-6, nylon-11, aromatic polyamides, polyamide-imide resins, polycarbonates, poly(vinyl chlorides), poly(vinylidene chlorides), polyketone resins, polysulfone resins, poly(phenylene sulfide) resins, poly(ether imide) resins, fluorocarbon resins, polyarylate resins, liquid-crystalline polymeric resins, poly(phenylene ether) resins, thermoplastic polyimide resins, and non-thermoplastic polyimide resins.

To achieve satisfactory adhesion to the layer A, a thermosetting resin or a thermoplastic resin may be incorporated in one or both surfaces of the single-layer film, and the single-layer film may be treated with an organic compound, such as an organic monomer or a coupling agent. Here, use of a thermoplastic polyimide resin achieves higher adhesion to the layer A and is thus preferable. Furthermore, two or more films each composed of a material exemplified in the case of the single-layer film described above may be laminated using an adhesive.

An example of the polymeric film that satisfies the above-described requirements is a non-thermoplastic polyimide film. Thus, the non-thermoplastic polyimide film is preferably used as the polymeric film of the present invention. The non-thermoplastic polyimide film used for the layer C of the present invention can be produced by a known method. That is, the non-thermoplastic polyimide film is produced by flow-casting a polyamic acid onto a support and chemically or thermally imidizing the flow-cast polyamic acid. A chemical imidization method, i.e., the method in which a chemical converter (dehydrator) represented by an acid anhydride, such as acetic anhydride, and a catalyst typified by, for example, a tertiary amine, such as isoquinoline, β-picoline, or pyridine, are allowed to react in an organic solvent solution of a polyamic acid, is preferable from the standpoint of the toughness, rupture strength, and productivity of the film. Furthermore, a process combining the chemical imidization method with a heat curing method is more preferable.

Any known polyamic acid may be basically used as the polyamic acid. Usually, substantially equimolar amounts of at least one aromatic acid dianhydride and at least one diamine are dissolved in an organic solvent, and the resulting organic solvent solution of the polyamic acid is stirred under controlled temperature conditions until the polymerization of the acid dianhydride with the diamine is completed, thereby producing the polyamic acid.

Examples of the acid dianhydride suitable for synthesizing non-thermoplastic polyimide according to the present invention include aromatic tetracarboxylic dianhydrides, such as pyromellitic dianhydride, 3,3',4,4'-benzophenonetetracarboxylic dianhydride, bis(3,4-dicarboxyphenyl) sulfone dianhydride, 2,3,3',4'-biphenyltetracarboxylic dianhydride, 3,3',4,4'-biphenyltetracarboxylic dianhydride, oxydiphthalic dianhydride, bis(2,3-dicarboxyphenyl)methane dianhydride, bis(3,4-dicarboxyphenyl)methane dianhydride, 1,1-bis(2,3-dicarboxyphenyl)ethane dianhydride, 1,1-bis(3,4-dicarboxyphenyl)ethane dianhydride, 1,2-bis(3,4-dicarboxyphenyl)ethane dianhydride, 2,2-bis(3,4-dicarboxyphenyl)propane dianhydride, 1,3-bis(3,4-dicarboxyphenyl)propane dianhydride, 4,4'-hexafluoroisopropylidenediphthalic anhydride, 1,2,5,6-naphthalenetetracarboxylic dianhydride, 2,3,6,7-naphthalenetetracarboxylic dianhydride, 3,4,9,10-perylenetetracarboxylic dianhydride, p-phenylenebis(trimellitic acid monoester anhydride), ethylenebis(trimellitic acid monoester anhydride), bisphenol A bis(trimellitic acid monoester anhydride), 4,4'-(4,4'-isopropylidenediphenoxy)bis(phthalic anhydride), and p-phenylenediphthalic anhydride; and analogues thereof.

Among the acid dianhydrides used for synthesizing the non-thermoplastic polyimide according to the present invention, pyromellitic dianhydride, oxydiphthalic dianhydride, 3,3',4,4'-benzophenonetetracarboxylic dianhydride, 3,3',4,4'-biphenyltetracarboxylic dianhydride, and p-phenylenebis(trimellitic acid monoester anhydride) are preferable. These are preferably used alone or as a mixture at any desired ratio.

Examples of diamine usable for synthesizing the non-thermoplastic polyimide according to the present invention include 1,4-diaminobenzene(p-phenylenediamine), 1,3-diaminobenzene, 1,2-diaminobenzene, 3,3'-dichlorobenzidine, 3,3'-dimethylbenzidine, 3,3'-dimethoxybenzidine, 3,3'-dihydroxybenzidine, 3,3',5,5'-tetramethylbenzidine, 4,4'-diaminodiphenylpropane, 4,4'-diaminodiphenylhexafluoropropane, 1,5-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl-N-methylamine, 4,4'-diaminodiphenyl-N-phenylamine, 4,4'-diaminodiphenyl ether, 3,4'-diaminodiphenyl ether, 3,3'-diaminodiphenyl ether, 4,4'-diaminodiphenyl thioether, 3,4'-diaminodiphenyl thioether, 3,3'-diaminodiphenyl thioether, 3,3'-diaminodiphenylmethane, 3,4'-diaminodiphenylmethane, 4,4'-diaminodiphenylmethane, 4,4'-diaminodiphenyl sulfone, 3,4'-diaminodiphenyl sulfone, 3,3'-diaminodiphenyl sulfone, 4,4'-diaminobenzanilide, 3,4'-diaminobenzanilide, 3,3'-diaminobenzanilide, 4,4'-diaminobenzophenone, 3,4'-diaminobenzophenone, 3,3'-diaminobenzophenone, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 4,4'-bis(4-aminophenoxy)biphenyl, 4,4'-bis(3-aminophenoxy)biphenyl, bis[4-(3-aminophenoxy)phenyl] ketone, bis[4-(4-aminophenoxy)phenyl] ketone, bis[4-(3-aminophenoxy)phenyl]sulfide, bis

[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl] ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, bis[4-{4-(4-aminophenoxy)phenoxy}phenyl] sulfone, 1,4-bis[4-(4-aminophenoxy)-α,α-dimethylbenzyl]benzene, 1,3-bis[4-(4-aminophenoxy)-α,α-dimethylbenzyl]benzene, and 4,4'-diaminodiphenylethylphosphine oxide; and analogues thereof.

Among these diamines used for the non-thermoplastic polyimide film according to the present invention, 4,4'-diaminodiphenyl ether, 4,4'-diaminobenzanilide, and p-phenylenediamine are preferable. These are preferably used alone or as a mixture at any ratio.

Preferable combinations of the acid dianhydrides and the diamines in the present invention include a combination of pyromellitic dianhydride and 4,4'-diaminodiphenyl ether, a combination of pyromellitic dianhydride, 4,4'-diaminodiphenyl ether, and p-phenylenediamine, a combination of pyromellitic dianhydride, p-phenylenebis(trimellitic acid monoester anhydride), 4,4'-diaminodiphenyl ether, and p-phenylenediamine, and a combination of pyromellitic dianhydride, p-phenylenebis(trimellitic acid monoester anhydride), 3,3',4,4'-biphenyltetracarboxylic dianhydride, 4,4'-diaminodiphenyl ether, and p-phenylenediamine. A non-thermoplastic polyimide prepared from these combined monomers has, for example, appropriate elastic modulus, dimensional stability, and low water absorption coefficient and is suitably used for various laminates according to the present invention.

Examples of a suitable solvent used for synthesizing the polyamic acid include amide solvents, such as N,N-dimethylformamide, N,N-dimethylacetamide, and N-methyl-2-pyrrolidone. N,N-Dimethylformamide is particularly preferably used.

When imidization is performed by a chemical cure method, examples of a chemical converter incorporated in a polyamic acid composition according to the present invention include aliphatic acid anhydrides, aromatic acid anhydrides, N,N'-dialkylcarbodiimide, lower aliphatic halides, halogenated lower aliphatic halides, halogenated lower aliphatic acid anhydrides, arylphosphonic acid dihalides, and thionyl halides; and a mixture of two or more of these. Among these, an aliphatic anhydride, such as acetic anhydride, propionic anhydride, or butyric anhydride, is preferably used alone or a mixture of two or more of these is preferably used. The number of moles of the chemical converter incorporated is 1 to 10 times, preferably 1 to 7 times, and more preferably 1 to 5 times that of a polyamic acid in a polyamic acid solution. Furthermore, to effectively perform imidization, the chemical converter and a catalyst are preferably used simultaneously. Examples of the catalyst used include aliphatic tertiary amines, aromatic tertiary amines, and heterocyclic tertiary amines. Among these, a compound selected from the heterocyclic tertiary amines can be particularly preferably used. Specifically, quinoline, isoquinoline, β-picoline, or pyridine can be preferably used. The number of moles of the catalyst incorporated is 1/20 to 10 times, preferably 1/15 to 5 times, and more preferably 1/10 to 2 times that of the chemical converter. When the amounts of the chemical converter and the catalyst are small, imidization does not effectively proceed. On the contrary, when the amounts of these are excessively large, the rate of imidization is increased, thus resulting in difficult handling.

An example of the production of a polyimide film by a chemical method will be described below.

The polyamic acid polymer or a solution thereof containing a stoichiometrically excessive amount of a dehydrator and a catalytic amount of a tertiary amine is flow-cast or applied on a drum or an endless belt to form a film. The resulting film is dried at 150° C. or less for about 5 to 90 minutes to obtain a self-supporting polyamic acid film. The resulting self-supporting polyamic acid film is separated from the support, and the ends of the separated film are fixed. Then, the film is gradually heated to about 100° C. to 500° C. to be imidized. After cooling, the fixed ends are released to obtain a polyimide film.

Furthermore, to improve adhesion to the layer A, the polymeric film may be subjected to surface treatment. Specifically, examples of a method of performing surface treatment at the stage of producing the polymeric film include a method of applying an organic compound, such as a thermosetting resin, a thermoplastic resin, an organic monomer, or a coupling agent, as a primer; a method of performing surface treatment with a metal hydroxide or an organic alkali; a method of performing plasma treatment, corona treatment, or ion-gun treatment; or a method of grafting a surface. These methods may be employed alone or in combination in order to subject the polymeric film to surface treatment.

The thickness of the non-thermoplastic polyimide film is preferably 2 μm to 125 μm and more preferably 5 μm to 75 μm. At a thickness below this range, the rigidity of a laminate is insufficient, and handling of the film is difficult. On the other hand, at an excessively large film thickness, the distance between lines in a circuit in view of impedance control needs to be large in producing a printed circuit board, thus opposing the trends toward miniaturization and higher density. Furthermore, the linear expansion coefficient of the non-thermoplastic polyimide film used for the layer C is preferably low, in particular, 10 to 40 ppm and more preferably 10 to 20 ppm.

The tensile modulus of the non-thermoplastic polyimide film is measured according to the standard D882-81 of American Society for Testing and Materials (ASTM). A low tensile modulus reduces the rigidity of the film, thus resulting in the difficulty of handling. An excessively high tensile modulus reduces the flexibility of the film, thus resulting in disadvantages, such as the difficulty of the processing of the film by a roll-to-roll technique and the brittleness of the film. A polyimide film preferably has a tensile modulus of 3 to 10 GPa and more preferably 4 to 7 GPa.

(3) Insulating Sheet Including Layer A Having Surface a for Electroless Plating/Polymeric Film An insulating sheet including the layer A having the surface a for electroless plating/the polymeric film C may be used as an insulating sheet including at least two layers containing the layer A having the surface a according to the present invention. As the layer A having the surface a for electroless plating, the same layer as that described in section (Layer A having surface a) can be used. As the polymeric film layer C, the same layer as that described in subsection (Polymeric film layer C) in section "(2) Insulating sheet including layer A having surface a for electroless plating/polymeric film layer C/layer B for facing circuit separately provided" can be used.

(4) Insulating Sheet Including Layer A Having Surface a for Electroless Plating/Polymeric Film/Layer A' Having Surface a' for Electroless Plating Next, an insulating sheet including a polymeric film each side of which is provided with a layer for electroless plating will be described.

The layers A and A' are each required to contain a polyimide resin having a siloxane structure. The same components as those described in section (Layer A having surface a) can be used as components constituting the layers A and A'. However, the composition of a polyimide resin used is not necessarily identical to that of the polyimide resin described above. Furthermore, a different resin or a different filler may be incorporated. The same layer as that described in subsection (Polymeric film layer C) in section "(2) Insulating sheet including layer A having surface a for electroless plating/polymeric film layer C/layer B for facing circuit separately provided" can be used as the polymeric film layer C.

(5) Preferred Embodiments of Layer A, Layer B, and Layer C

The following insulating sheets have been described in detail:

(1) an insulating sheet including one outermost layer composed of the layer A having the surface a for electroless plating and the other outermost layer composed of a layer B for facing a circuit separately provided;
(2) an insulating sheet including the layer A having the surface a for electroless plating/a polymeric film layer C/a layer B for facing a circuit separately provided;
(3) an insulating sheet including the layer A having the surface a for electroless plating/a polymeric film; and
(4) an insulating sheet including the layer A having the surface a for electroless plating/a polymeric film/the layer A' having the surface a' for electroless plating. Here, the preferred embodiments of each layer will be described.

The overall thickness of each of the insulating sheets (1) to (4) is preferably in the range of 2 to 150 µm depending on the thickness of the circuit laminated on a substrate.

In each of the insulating sheets (1) and (2), the thickness of the outermost layer A constituting the insulating sheet of the present invention is preferably in the range of 10 Å to 50 µm, and the thickness of the outermost layer B is preferably in the range of 1 µm to 120 µm, from the standpoint of heat resistance and linear expansivity.

Furthermore, to achieve low linear expansivity, the layer B in each of the insulating sheets (1) and (2) may be combined with a filler. The amount of the filler added may be changed in response to a target linear expansion coefficient. Specifically, the amount of the filler added is in the range of 5 to 80 percent by volume and preferably 10% to 50%. Addition of a filler to a resin usually reduces the melt flowability of the resin. In the present invention, by combining the fillers, it is possible to avoid reducing in the melt flowability of the resin, i.e., it is possible to ensure satisfactory circuit-embedding properties, in spite of the addition of the filler. For example, it is possible to ensure the satisfactory circuit-embedding properties by, for example, using spherical fused silica or by subjecting the filler to surface treatment with a silane-based or titanium-based surface-treatment agent or coupling agent. The melt viscosity of the B-stage layer B is preferably 20,000 Pas or less and more preferably 2,000 Pas or less. Examples of a method for controlling the viscosity within the range described above include (i) use of a spherical filler, (ii) subjecting a filler to surface treatment, and (iii) use of a filler having a broad particle-size distribution. The methods (i) to (iii) may be employed in combination. With respect to the thickness of the layer B, the thickness of the insulating layer required is determined from the standpoint of the height of a facing circuit, the ratio of residual copper, and impedance control. In general, the thickness is preferably in the range of about half the height of the circuit faced to the height of the circuit. To be specific, the thickness is suitably in the range of 5 to 100 µm.

In each of the insulating sheets (1) and (2), with respect to the relationship between the thickness of the outermost layer A and the thickness of the outermost layer B, the thickness of the outermost layer B is preferably at least equal to and more preferably at least 1.5 times that of the outermost layer A from the standpoint of low linear expansivity. When the thickness is less than that of the layer A, the effect of the linear expansion coefficient of the outermost layer A is strong, thus tending to increase the linear expansion coefficient of the whole insulating sheet.

As described above, it is possible to reduce linear expansion coefficient by reducing the thickness of the outermost layer A, which tends to have a large linear expansion coefficient, containing a polyimide resin having a siloxane structure.

In each of the insulating sheets (2), (3), and (4), to reduce the linear expansion coefficient of the entire sheet, the thickness of the layer A is preferably small. Specifically, the thickness of the layer A is preferably up to equal to and more preferably up to half that of the layer C. Specifically, the thickness of the layer A is preferably 5 µm or less and more preferably 3 µm or less. Furthermore, with respect to elastic modulus, when the layer A has a high elastic modulus, the characteristics of the layer A dominate the linear expansion coefficient of the entire sheet. Therefore, the elastic modulus of the layer A is preferably small. Specifically, the elastic modulus is preferably up to equal to and more preferably up to half that of the layer C. Specifically, the elastic modulus of the layer A is preferably 4 GPa or less and more preferably 3 GPa or less.

In each of the insulating sheets (3) and (4), the linear expansion coefficient of the insulating sheet is preferably in the range of 5 to 60 ppm. The linear expansion coefficient of the insulating sheet can be controlled by adjusting a balance between the linear expansion coefficient and thickness of the polymeric film layer C and those of the layer A or A'. In particular, as a method for controlling the linear expansion coefficient of these insulating sheets, a method of reducing the linear expansion coefficient of the polymeric film is easy and is thus preferable.

In each of the insulating sheets (1) to (4), a support may be provided on the surface of the outermost layer A or the outermost layer B. Alternatively, supports may be provided on the surfaces of the outermost layer A and the outermost layer B.

The types of the support used for the insulating sheet of the present invention are not limited. Examples of the support usable include known resin films composed of, for example, poly(ethylene terephthalate) and polypropylene; and metal foils, such as a copper foil, an aluminum foil, and a nickel foil. To improve detachability, a resin film subjected to detaching treatment may be used. Since the outermost layer A is in contact with the support, the surface roughness of the support is preferably less than 0.5 µm in terms of the arithmetic average roughness Ra measured with a cutoff value of 0.002 mm so that the surface roughness of the outermost layer A is less than 0.5 µm in terms of arithmetic average roughness Ra measured with a cutoff value of 0.002 mm.

[Structure of Insulating Sheet Containing Inorganic Filler]

Preferred embodiments of the case in which an inorganic filler is added to an insulating sheet according to the present invention to reduce linear expansion coefficient will be described. In the case of an insulating sheet containing an inorganic filler, the content x of the inorganic filler present in one surface layer X and the content y of the inorganic filler in the other surface layer Y preferably satisfy the following relationship:

x<y (wherein x and y each represent percent by volume per unit volume).

The surface having the surface layer X can ultimately be a surface on which a metal layer is provided. Therefore, in the present invention, the surface layer X is a region that affects surface properties. Specifically, the surface layer X represents a region from the surface to a 5-μm depth.

The surface layer Y represents a region 50% of the thickness of the entire insulating sheet. The surface having the surface layer Y is preferably a surface for facing a circuit provided.

The important feature of the present invention is to satisfy the above-described relationship between the contents of the inorganic filler in the surface layers X and Y. A reduction in the content of the inorganic filler present in the surface layer X can reduce the surface roughness. As a result, it is possible to form fine lines on the surface having the surface layer X. Furthermore, the present inventors found that the addition of the inorganic filler to the insulating sheet disadvantageously reduces the insulation between the circuits. As a result of the pursuit of the cause, the present inventors found the following: Electroless plating copper is deposited in a minute gap between the insulating resin and the bottom of the filler exposed in the surface. When an attempt is made to remove the electroless plating copper layer in a subsequent etching step, the etchant does not sufficiently reach the gap. As a result, the electroless plating copper remains in the gap to degrade the insulation.

Therefore, from the standpoint of the maintenance of the insulation between circuits and small surface roughness such that a fine-pitch circuit can be formed, the content of the inorganic filler only in the surface layer X, which ultimately has a metal layer, is relatively reduced.

On the other hand, to reduce the linear expansion coefficient of the insulating sheet, the content of the inorganic filler present in a region other than the surface layer X is adjusted to reduce the linear expansion coefficient of the entire insulating sheet. In the present invention, in comparison with the content y of the inorganic filler in the other surface, i.e., the surface layer Y, the relationship:

x<y should be satisfied. It is preferable that the ratio x/y be 0.5 or less. It is more preferable that the ratio x/y be 0.3 or less. Particularly preferably, the filler is not present in the surface layer X.

An example of the method for forming the insulating sheet will be described. As described in section (Insulating sheet including at least two layers containing layer A having surface a), a method of laminating a layer having the surface layer X (also referred to as "outermost layer A"), a layer having the surface layer Y (also referred to as "outermost layer B"), and, if necessary, the other layer may be employed. By adjusting the content of the inorganic filler in each of these layers, the contents of the inorganic filler in the surface layers X and Y should satisfy the relationship.

(Content of Filler in Outermost Layer A)

The content (a percent by weight) of the inorganic filler in the outermost layer A will be described. It is important that the content a of the inorganic filler be adjusted so as to achieve low linear expansivity and so as not to achieve excessively increased surface roughness of the outermost layer A and expose the inorganic filler to the surface. To satisfy the requirements, a is preferably 0 to 30 percent by weight, more preferably 0 to 20 percent by weight, and still more preferably 0 to 10 percent by weight.

The outermost layer A according to the present invention preferably has a low-roughness surface achieved by adding the inorganic filler in an amount such that the surface roughness is not excessively increased and the inorganic filler is not exposed to the surface. Therefore, preferably, the outermost layer A can be strongly bonded to an electroless copper plating film. This enables the production of a printed circuit board having a satisfactory insulation between circuits and capable of having fine lines. Therefore, the outermost layer A is not particularly limited as long as the outermost layer A is composed of the polymeric material such that an electroless copper plating film is strongly bonded to the low-roughness surface achieved by adding a predetermined amount of the inorganic filler.

(Outermost Layer B)

The content (b percent by weight) of the inorganic filler in the outermost layer B will be described. The content b of the inorganic filler significantly contributes to the achievement of low linear expansivity and thus is preferably maximized as much as possible. On the other hand, by adding the inorganic filler, a cured insulating sheet tends to be brittle. Thus, it is important to add a suitable amount of the inorganic filler. To satisfy this, the content b is preferably 10 to 80 percent by weight, more preferably 20 to 60 percent by weight, and still more preferably 30 to 50 percent by weight.

The resulting layer B containing the filler is in a semi-cured state. The minimum melt viscosity is preferably in the range of 10 Pa·s to 10,000 Pa·s under the temperature range of 60° C. to 200° C.

As described above, the outermost layer B is required to have satisfactory electrical properties, mechanical properties, and thermal properties. These properties are also required as properties of the entire insulating sheet according to the present invention. Thus, satisfactory properties of the outermost layer B alone are insufficient to the properties of the entire insulating sheet, in some cases. By adjusting the properties of the outermost layer B or the other layer, it is possible to achieve target physical properties as a whole. In particular, in the case of an insulating sheet including two layers that are the layer A and the layer B, for the practical purposes, it is preferred for the present invention that the outermost layer B singly have satisfactory these properties. Therefore, the outermost layer B is required to be designed such that these properties are achieved.

Specifically, the term "electrical properties" means a low dielectric loss tangent, a low dielectric constant, and the like. The dielectric loss tangent of the entire insulating sheet is preferably 0.025 or less, more preferably 0.020 or less, and still more preferably 0.015 or less.

Specifically, the term "mechanical properties" means, for example, a large tensile strength from the standpoint of reliability in a heat cycle test or the like. The tensile strength of the entire insulating sheet according to the present invention is preferably 50 MPa or more, more preferably 80 MPa or more, and still more preferably 100 MPa or more.

Specifically, the term "thermal properties" means low linear expansion coefficient. As described above, in the present invention, it is possible to achieve the thermal properties by adding the inorganic filler to the outermost layer A and the outermost layer B. The linear expansion coefficient of the entire insulating sheet according to the present invention is preferably 50 ppm/° C. or less, more preferably 45 ppm/° C. or less, and still more preferably 40 ppm/° C. or less.

(Inorganic Filler)

The inorganic filler used in the present invention is not particularly limited. Examples thereof include fused silica, crystalline silica, and alumina. These may be used alone or in combination. Among these, spherical fused silica (spherical silica) has a small adverse effect on resin flowability, which is a preferable effect in the present invention, and has the effect of reducing the linear expansion coefficient as a whole, and thus can be preferably used. The spherical silica is not particularly limited as long as the spherical silica has a substantially globular shape and is principally composed of silica ($SiO_2$). The roundness of the spherical filler should be 0.5 or more and is preferably 0.6 or more and more preferably 0.8 or more. The spherical silica used in the present invention has a substantially smooth surface and can be assumed to have substantially no irregularities. Furthermore, the spherical silica has a shape that is met with a low resistance from fluid because of a low aspect ratio. Therefore, even when the outermost layer B according to the present invention melts while a step of curing the outermost layer B from a semi-cured state, the flowability of the molten resin composition is not precluded. In addition, it is possible to prevent an increase in melt viscosity and to reduce linear expansion coefficient after curing.

(Thickness of Each Layer)

The thicknesses of the outermost layers A and B affect properties, such as linear expansion coefficient, of the entire insulating sheet according to the present invention. The linear expansion coefficient of the outermost layer B containing a larger amount of the inorganic filler tends to be smaller than that of the outermost layer A depending on a component other than the inorganic filler in each layer. As a simple method, the linear expansion coefficient of the entire insulating sheet can be predicted from "sum of (thermal expansion coefficient)×(thickness fraction) of each layer". Therefore, to reduce the linear expansion coefficient of the entire insulating sheet according to the present invention, an increase in the thickness fraction of a layer having a small linear expansion coefficient, i.e., the outermost layer B, is effective and is preferable in the present invention. Specifically, the thickness of the outermost layer A is preferably smaller than that of the outermost layer B. That is, the thickness fraction of the outermost layer B is preferably 50% or more and more preferably 75% or more.

In this way, it is possible to achieve the small linear expansion coefficient of the entire insulating sheet after curing. For example, it is possible to achieve a linear expansivity of 50 ppm/° C. or less.

The thickness of the entire insulating sheet according to the present invention is not particularly limited and should be determined on the basis of the thickness of a circuit to be embedded by lamination and the thickness of an insulating sheet obtained after lamination. Usually, the entire insulating sheet having a thickness of 10 to 300 μm is preferably usable.

[Process for Producing Insulating Sheet Including at Least Two Layers Containing Layer A Having Surface a]

A process for producing an insulating sheet including at least two layers containing the layer A having the surface a will be described below, but the present invention is not limited thereto.

(1) In the case of the insulating sheet including one outermost layer composed of the layer A having the surface a for electroless plating and the other outermost layer composed of the layer B for facing a circuit separately provided, first, a thermoplastic polyimide resin and, if necessary, other components, which are to be incorporated in the outermost layer A, are fed into a suitable solvent, and the mixture is stirred to prepare a homogeneous resin solution or dispersion corresponding to the outermost layer A. Then, the resulting resin solution or dispersion is flow-cast on the above-described support. The resin solution for forming the outermost layer A is dried to obtain the outermost layer A. Subsequently, a similarly prepared resin solution for forming the outermost layer B is flow-cast on the outermost layer A. Then, the resin solution is dried to obtain an inventive insulating sheet on the support, the insulating sheet including the outermost layer A and the outermost layer B.

Alternatively, a process of flow-casting the resin solution for forming the outermost layer A, not drying the resulting solution, and flow-casting the outmost layer B resin solution on the undried resin solution for forming the outermost layer A is employed. This process has satisfactory productivity and is thus preferably feasible.

Here, since the outermost layer B is required to fill in an inner circuit, the thermosetting resin composition constituting the outermost layer B should be in a semi-cured state (B stage). To achieve the semi-cured state, it is important to appropriately control the drying temperature and time.

Furthermore, the insulating sheet according to the present invention may contain another layer other than the outermost layers A and B. In this case, after forming the outermost layer A, the layer C is formed by the same process as that above, and then the outermost layer B is formed on the layer C. For example, in the case of (2) the insulating sheet including the layer A having the surface a for electroless plating/the polymeric film C/the layer B for facing the circuit separately provided, this is flow-cast on one surface of the polymeric polyimide film layer C, and the resin solution for forming the layer A is dried. Subsequently, a similarly prepared resin solution for forming the layer B is flow-cast on the other surface of the layer C, and then the resin solution is dried to obtain the insulating sheet.

Here, since the layer C is required to fill in an inner circuit, the thermosetting resin composition constituting the layer C should be in a semi-cured state (B stage). To achieve the semi-cured state, it is important to appropriately control the drying temperature and time.

In producing (3) the insulating sheet including the layer A having the surface a for electroless plating/the polymeric film or (4) the insulating sheet including the layer A having the surface a for electroless plating/the polymeric film/the layer A' having the surface a' for electroless plating, first, a thermoplastic polyimide resin and, if necessary, other component, which are to be incorporated in either the layer A or layers A and A', are fed into a suitable solvent, and the mixture is stirred to prepare a homogeneous resin solution or dispersion corresponding to the outermost layer A. Then, the resulting resin solution or dispersion is flow-cast on the polymeric film used in the present invention. The resin solution corresponding to the layer A is dried to obtain the inventive insulating sheet including a layer A/polymeric film structure.

In the resulting stack including a layer A/polymeric film structure, a solution corresponding to the layer A' is flow-cast on the polymeric film surface not provided with the layer A, and then the resin solution for forming the layer A' is dried to obtain the inventive insulating sheet including a layer A/polymeric film/layer A' structure.

Alternatively, the solution for forming the layer A is applied on both surfaces of the polymeric film, followed by drying. Thereby, it is possible to obtain an inventive insulating sheet including a layer A/polymeric film/layer A structure.

In the case of the layer A having a small thickness, the irregularities of the surface of the polymeric film affect the surface of the layer A, in some cases. It is preferable to use a polymeric film containing a surface having a surface roughness of 0.5 μm or less in terms of arithmetic average roughness measured with a cutoff value of 0.002 mm.

Furthermore, it is also possible to produce the insulating sheet including a layer A/polymeric film structure and a layer A/polymeric film/layer A' structure by applying the solutions corresponding the layer A and the layer A' onto polymeric films and/or metal foils functioning as supports; drying the solutions to prepare a support-containing film having the layer A and a support-containing film having the layer A', respectively; stacking the resulting films with the respective polymeric films by, for example, pressing or laminating; and removing the supports by a physical method or a chemical method, such as etching. However, in this case, in order that the surface roughness of each of the layer A and the layer A' is maintained at 0.5 μm or less in terms of arithmetic average roughness measured with a cutoff value of 0.002 mm, it is necessary to use supports each having a surface roughness of 0.5 μm or less in terms of arithmetic average roughness measured with a cutoff value of 0.002 mm.

Furthermore, in the stack according to the present invention, the polymeric film may be a film including two or more layers in addition to a single-layer film. In this case, for example, it is possible to obtain the stack by forming a thermosetting resin or a thermoplastic resin after formation on a non-thermoplastic film; or by treatment with an organic compound, such as, an organic monomer or a coupling agent, to produce a polymeric film and then forming either the layer A or the layer A and the layer A' on the polymeric film.

The resulting stacks having various structures are directly subjected to electroless plating or are subjected to desmearing and then electroless plating. Thereby, it is possible to obtain laminates having various structures and each having an electroless plating film on the layer A.

[Electroless Plating]

Examples of electroless plating that can be employed in the present invention include electroless copper plating, electroless nickel plating, electroless gold plating, electroless silver plating, and electroless tin plating. From an industrial viewpoint and from the standpoint of electrical characteristics, such as migration resistance, electroless copper plating and electroless nickel plating are preferable. Electroless copper plating is particularly preferable. When the insulating sheet according to the present invention is subjected to electroless plating, the insulating sheet may be directly subjected to electroless plating or may be subjected to desmearing and then electroless plating.

[Printed Circuit Board]

The insulating sheet according to the present invention can be preferably used in the application of printed circuit boards. A flexible printed circuit board including the insulating sheet according to the present invention not only has a satisfactory characteristics, such as adhesion to a conductive layer and dimensional stability, but also has the following advantages: by electroplating the laminate having the electroless plating film according to the present invention, the thickness of the resulting plating film can be desirably changed; and the flexible printed circuit board can be suitably used in the application of electronic information devices, each of which requires a flexible printed circuit board having a fine pattern and high flexibility, since the resulting plating film has satisfactory flexibility and rigidity.

Examples of a method for producing a printed circuit board including (1) the insulating sheet containing one outermost layer composed of the layer A having the surface a for electroless plating and the other outermost layer composed of the layer B for facing a circuit separately provided or (2) the insulating sheet containing the layer A having the surface a for electroless plating/the polymeric film layer C/the layer B for facing a circuit separately provided will be described.

It is possible to employ a method of laminating an inner substrate including a metal foil, an insulating sheet, and a patterned circuit provided in that order with the insulation film such that the patterned circuit faces the outermost layer B to fill gaps between lines in the circuit with mainly the outermost layer B; removing the metal foil by etching to expose the outermost resin layer A; and subjecting the surface of the outermost layer A to electroless plating to obtain a metal layer for forming a patterned circuit. This method can be suitably applied to a method for forming a patterned circuit by an additive process. In particular, this method is suitably employed for the case in which the formation of fine lines is required. Furthermore, this method is also applicable when a single-layer sheet is used.

It is also possible to employ another method of laminating an inner substrate including an insulating sheet having a resin film base and a patterned circuit provided in that order with the insulation film such that the patterned circuit faces the outermost layer B to fill gaps between lines in the circuit with mainly the outermost layer B; separating the resin film base to expose the outermost layer A; and subjecting the surface of the outermost layer A to electroless plating to obtain a metal layer for forming a patterned circuit. This method can be suitably applied to a method for forming a patterned circuit by an additive process. In particular, this method is suitably employed for the case in which the formation of fine lines is required. Furthermore, this method is also applicable when a single-layer sheet is used.

It is also possible to employ another method of laminating an inner substrate including a metal foil, an insulating sheet, and a patterned circuit provided in that order with the insulation film such that the patterned circuit faces the outermost layer B to fill gaps between lines in the circuit with mainly the outermost layer B; removing the metal foil by etching to expose the outermost layer A; and subjecting the surface of the outermost layer A to electroless plating and electroplating to obtain a metal layer including an electroplating film/an electroless plating film. This method can be suitably applied to a method for forming a patterned circuit by a subtractive process. Furthermore, this method is also applicable when a single-layer sheet is used.

It is also possible to employ another method of laminating an inner substrate including an insulating sheet having a resin film base and a patterned circuit provided in that order with the insulation film such that the patterned circuit faces the outermost layer B to fill gaps between lines in the circuit with mainly the outermost layer B; separating the resin film base to expose the outermost layer A; and subjecting the surface of the outermost layer A to electroless plating and electroplating to obtain a metal layer including an electroplating film/an electroless plating film. This method can be suitably applied to a method for forming a patterned circuit by a subtractive process.

In producing a multilayer printed circuit board, the formation of a via is required for an electrical connection in the perpendicular direction. In the printed circuit board according to the present invention, a process for forming a via by a known method, such as laser, mechanical drilling, or punching, and then providing conductivity with known conductive paste or by a known method, such as electroless plating or direct plating can be employed and is preferably feasible.

At least the outermost layer B in the insulating sheet according to the present invention has an appropriate flowability in a semi-cured state. Thus, gaps between lines in a patterned circuit can be satisfactorily filled with mainly the outermost layer B by thermal compression bonding, such as thermal pressing, vacuum pressing, laminating (thermal laminating), vacuum laminating, hot roll laminating, or vacuum hot roll laminating. Among these, by performing treatment under vacuum, i.e., vacuum pressing, vacuum laminating, or vacuum hot roll laminating, the gaps between the lines in the circuit can be successfully filled without void. Such treatment is preferably feasible. Furthermore, this method is also applicable when a single-layer sheet is used.

The treatment temperature in the thermal compression bonding is not particularly limited but is preferably in the range of 50° C. to 250° C., more preferably 60° C. to 200° C., and still more preferably 80° C. to 180° C. When the treatment temperature exceeds 250° C., there is a possibility that the insulating sheet according to the present invention is cured during thermal compression bonding, and the lamination is thus not satisfactorily performed. On the other hand, when the treatment temperature is less than 50° C. or less, the outermost layer B has low flowability, thereby being difficult to fill the conductive lines in the patterned circuit.

Furthermore, the treatment time and treatment pressure in the thermal compression bonding are not particularly limited and should be appropriately set in response to the characteristics of an apparatus used and the flowability of the outermost layer B. Usually, the treatment time is preferably several seconds to 3 hours, and the treatment pressure is preferably 0.1 MPa to 5 MPa.

The outermost layer B provided on the conductive patterned circuit serves as a component for protecting the conductive patterned circuit or as a interlayer insulating component in a multilayer printed circuit board. Therefore, after filling in the patterned circuit, it is preferable to completely cure the outermost layer B. A specific heat-curing process is not particularly limited. Heat curing is preferably performed under the conditions such that the thermosetting resin composition constituting the outermost layer B in the insulating sheet can be sufficiently cured. When the outermost layer B is cured, post-heating is preferably performed after or simultaneously with a lamination step so that the curing reaction of the thermosetting resin composition sufficiently proceeds. The conditions of the post-heating is not particularly limited, but heating is preferably performed at a temperature range of 150° C. to 200° C. for 10 minutes to 3 hours.

The printed circuit board according to the present invention includes a resin layer containing the above-described insulating sheet. Thus, it is possible to satisfactorily maintain the excellent formability of a fine-pitch circuit. Furthermore, it is possible to impart well-balanced characteristics, such as processability, handleability, and resin flowability. Thereby, the printed circuit board can be suitably produced.

Furthermore, to improve adhesion between the outermost layer A and the electroless-plating film, heating can also be performed after the formation of the electroless-plating film.

Next, examples of a method for producing a multilayer printed circuit board including (3) the insulating sheet including the layer A having the surface a for electroless plating/the polymeric film or (4) the insulating sheet including the layer A having the surface a for electroless plating/the polymeric film/the layer A' having the surface a' for electroless plating will also be described. An inner substrate including an inventive stack containing the layer A/the polymeric film layer C, an interlayer adhesive, and a patterned circuit provided in that order is laminated with the insulating sheet such that a laminate including the layer A/polymeric film layer/the interlayer adhesive/the inner substrate is produced. Then, the exposed surface of the layer A is subjected to electroless plating to form an electroless plating film for forming a patterned circuit. This method can be suitably applied to a method for forming a patterned circuit by a semi-additive process. In particular, this method is suitably employed for the case in which the formation of fine lines is required.

As another example of a method for producing a multilayer printed circuit board, an inventive stack containing the layer A/the polymeric film layer C/the layer A' provided in that order is laminated with an inner substrate including a patterned circuit such that a laminate including the layer A/the polymeric film layer C/layer A'/the inner substrate is produced. Then, the exposed surface of the layer A is subjected to electroless plating to form an electroless plating film for forming a patterned circuit. In this case, the layer A' preferably has a thickness such that the inner circuit is adequately filled with the layer A'.

In the above case, when a printed circuit board including a glass-epoxy base is used as the inner substrate, a build-up circuit board is produced. Alternatively, when a flexible printed circuit board is used as the inner circuit, a multilayer flexible circuit board is produced. In the multilayer circuit board, the formation of a via is required for an electrical connection in the perpendicular direction. In the printed circuit board according to the present invention, a process for forming a via by a known method, such as laser, mechanical drilling, or punching, and then providing conductivity with known conductive paste or by a known method, such as electroless plating or direct plating can be employed and is preferably feasible.

Furthermore, in the above case, it is possible to perform electroplating after electroless plating to obtain a metal layer including a electroplating film/the electroless plating film, the metal layer being used for forming a patterned circuit. This method can be suitably applied to a method for forming a patterned circuit by a subtractive process.

In a laminating step in the multilayer printed circuit board, thermal compression bonding, such as thermal pressing, vacuum pressing, laminating (thermal laminating), vacuum laminating, hot roll laminating, or vacuum hot roll laminating, is feasible.

Furthermore, to improve adhesion between the layer A and the electroless plating film, heating can also be performed after the formation of the electroless-plating film.

[Solution According to the Invention]

A solution according to the present invention contains a polyimide resin and is used for forming the surface a. The solution may further contain another component other than the polyimide solution. Furthermore, any solvent capable of dissolving such a resin component can be used. Here, the term "dissolution" means that at least one percent by weight of the resin component is dissolved in the solvent.

The solution is applied on a predetermined component by a known method, such as dipping, spray coating, or spin coating, and the applied solution is dried to form the surface a.

Furthermore, a solution according to the present invention contains a polyamic acid serving as a precursor of a polyimide resin and is used for forming the surface a. As described above, the solution may further contain another component other than the polyamic acid solution. Furthermore, any solvent capable of dissolving such a resin component can be used. Here, the term "dissolution" means that at least one percent by weight of the resin component is dissolved in the solvent.

The solution is applied on a predetermined component by a known method, such as dipping, spray coating, or spin coating, and imidized to form the surface a. Both a thermal process for performing dehydration by heating the polyamic acid solution and a chemical process of performing dehydration with a dehydrator can be employed for imidization. Alternatively, a process for performing imidization by heating under reduced pressure can be employed. Among these processes, the process of performing imidization by the thermal process of performing dehydration by heating can be preferably employed from the standpoint of ease of treatment and satisfactory productivity. In this process, after applying the solution containing the polyamic acid, imidization can be performed simultaneously with drying.

[Process for Producing Component for Plating According to the Invention]

A process for producing a component for plating according to the present invention will be described below.

A form of the component for plating according to the present invention is a solution containing a polyimide resin. For example, the solution for forming the surface a for electroless plating is prepared. The solution is applied onto a predetermined component, such as an inner circuit board or a polymeric film, by a known method, such as dipping, spray coating, or spin coating, and the applied solution is dried to form the surface a.

Another form of the component for plating according to the present invention is a polyamic acid solution. For example, the solution for forming the surface A for electroless plating is prepared. The solution is applied onto a predetermined component, such as an inner circuit board or a polymeric film, by a known method, such as dipping, spray coating, or spin coating, and the applied solution is imidized to form the surface A.

The forms and usage directions of the component for plating according to the present invention are exemplified. However, the present invention is not limited thereto.

EXAMPLES

The present invention will be described in detail based on examples. However, the present invention is not limited thereto. It will be obvious to those skilled in the art that various changes, modifications, and alterations may be made without departing from the scope of the invention.

In Examples 1 to 8 and Comparative Examples 1 and 2, adhesion to an electroless plating copper film and surface roughness Ra are evaluated or calculated as described below.

[Evaluation of Adhesion]

An insulating sheet including a layer A having a surface a/a support (poly(ethylene terephthalate) film) was produced. The layer A was allowed to face a glass epoxy substrate FR-4 (product ID: MCL-E-67, manufactured by Hitachi Chemical Co., Ltd.; thickness of copper foil: 50 μm, total thickness: 1.2 mm), and heat and pressure were applied for 6 minutes at a temperature of 170° C. and a pressure of 1 MPa under vacuum. Then, the poly(ethylene terephthalate) film was separated. Heating was performed at 130° C. for 10 minutes, 150° C. for 10 minutes, and 180° C. for 30 minutes to produce a laminate including the layer A having the surface a/FR-4. Then, a copper layer was formed on the exposed surface a. With respect to the formation of the copper layer, after desmearing and electroless copper plating were performed, an electroplating copper layer having a thickness of 18 μm was formed on the resulting electroless plating copper layer. After drying at 180° C. for 30 minutes, adhesion strength was measured in a normal state and after a pressure cooker test (PCT) according to JPCA-BU01-1998 (issued by Japan Electronics Packaging and Circuits Association). Desmearing and electroless copper plating were performed by processes shown in Tables 1 and 2.

Adhesion strength in normal state: adhesion strength measured after left to stand for 24 hours at a temperature of 25° C. and a humidity of 50%.

Adhesion strength after PCT: adhesion strength measured after left to stand for 96 hours at a temperature of 121° C. and a humidity of 100%.

TABLE 1

| Step | Solution Composition | | | Process temp | Process Time |
|---|---|---|---|---|---|
| Swelling | Swelling Dip Securiganth | 500 | ml/l | 60° C. | 5 min |
| | Sodium Hydroxide | 3 | g/l | | |
| Water Washing | | | | | |
| Micro-etching | Concentrated Compact CP | 550 | ml/l | 80° C. | 5 min |
| | Sodium Hydroxide | 40 | g/l | | |
| Water Washing | | | | | |
| Neutralization | Reduction Solution Securiganth P500 | 50 | ml/l | 40° C. | 5 min |
| | Sulfuric Acid | 70 | ml/l | | |

TABLE 2

| Step | Solution Composition | | | Process Temp. | Process Time |
|---|---|---|---|---|---|
| Cleaner Conditioner | Cleaner Securiganth 902 | 40 | ml/l | 60° C. | 5 min |
| | Cleaner Additive 902 | 3 | ml/l | | |
| | Sodium Hydroxide | 20 | g/l | | |
| Water Washing | | | | | |
| Pre-dipping | Pre-dip Neoganth-B | 20 | ml/l | Room Temp. | 1 min |
| | Sulfuric Acid | 1 | ml/l | | |
| Catalyst Addition | Activator Neoganth 834 Conc. | 40 | ml/l | 40° C. | 5 min |
| | Sodium Hydroxide | 4 | g/l | | |
| | Boric Acid | 5 | g/l | | |
| Water Washing | | | | | |
| Activation | Reducer Neoganth | 1 | g/l | Room Temp. | 2 min |
| | Sodium Hydroxide | 5 | g/l | | |

TABLE 2-continued

| Step | Solution Composition | | Process Temp. | Process Time |
|---|---|---|---|---|
| Water Washing | | | | |
| Electroless Copper Plating | Basic Solution Printganth MSKDK | 80 ml/l | 32° C. | 15 min |
| | Copper Solution Printganth MSK | 40 ml/l | | |
| | Reducer Cu | 14 ml/l | | |
| | Stabilizer Printganth MSKDK | 3 ml/l | | |

[Measurement of Surface Roughness Ra]

The surface roughness Ra of the surface a of a sample in a state before electroless plating (state in which desmearing was completed) in the procedure for producing a sample described in the above item of measurement of adhesion was measured. The arithmetic average roughness Ra of the surface A was measured with an optical-interferometric surface profiler (Model: NewView 5030 system, manufactured by Zygo Corporation) under the following conditions.
(Measurement Condition)
Objective lens: ×50 Mirau, image zoom: 2
FDA Res: Normal
Analysis Condition
Remove: Cylinder
Filter: High Pass
Filter Low Waven: 0.002 mm Synthesis Example 1 of Polyimide Resin A KF-8010 (62 g, 0.075 mol) (manufactured by Shin-Etsu Chemical Co., Ltd.), 4,4'-diaminodiphenyl ether (15 g, 0.075 mol), and N,N-dimethylformamide (hereinafter referred to as "DMF") were fed into a 2,000-mL glass flask and dissolved under stirring. Then, 4,4'-(4,4'-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated at 200° C. for 120 minutes under a reduced pressure of 665 Pa to obtain a polyimide resin 1.

Synthesis Example 2 of Polyimide Resin

A KF-8010 (37 g, 0.05 mol) (manufactured by Shin-Etsu Chemical Co., Ltd.), 4,4'-diaminodiphenyl ether (21 g, 0.10 mol), and DMF were fed into a 2,000-mL glass flask and dissolved under stirring. Then, 4,4'-(4,4'-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated in a vacuum oven at 200° C. for 120 minutes under a reduced pressure of 665 Pa to obtain a polyimide resin 2.

Synthesis Example 3 of Polyimide Resin

A KF-8010 (123 g, 0.15 mol) (manufactured by Shin-Etsu Chemical Co., Ltd.) and N,N-dimethylformamide (hereinafter referred to as "DMF") were fed into a 2,000-mL glass flask and dissolved under stirring. Then, 4,4'-(4,4'-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated in a vacuum oven at 200° C. for 120 minutes under a reduced pressure of 665 Pa to obtain a thermoplastic polyimide resin 3.

Synthesis Example 4 of Polyimide Resin

Into a 2,000-mL glass flask, 1,3-bis(3-aminophenoxy)benzene (41 g, 0.143 mol), 3,3'-dihydroxy-4,4'-diaminobiphenyl (1.6 g, 0.007 mol), and DMF were fed and dissolved under stirring. Then, 4,4'-(4,41-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated in a vacuum oven at 200° C. for 180 minutes under a reduced pressure of 665 Pa to obtain a polyimide resin 4.

Preparation Example 1 of Solution for Forming Layer A

The polyimide resin 1 was dissolved in dioxolane to prepare a solution (1) for forming the layer A. The solid content was set to 15 percent by weight.

Preparation Example 2 of Solution for Forming Layer A

The polyimide resin 2 was dissolved in dioxolane to prepare a solution (2) for forming the layer A. The solid content was set to 15 percent by weight.

Preparation Example 3 of Solution for Forming Layer A

The polyimide resin 3 was dissolved in dioxolane to prepare a solution (3) for forming the layer A. The solid content was set to 15 percent by weight.

Preparation Example 4 of Solution for Forming Layer A

The polyimide resin 4 was dissolved in dioxolane to prepare a solution (4) for forming the layer A. The solid content was set to 15 percent by weight. Then, 90 g of the solution (3) were mixed with 10 g of the solution (4) to obtain a solution (5) for forming the layer A.

Preparation Example 5 of Solution for Forming Layer A

A polyimide silicone solution (X-22-8917 (solid content: 20 percent by weight, cyclohexanone solution), manufactured by Shin-Etsu Chemical Co., Ltd.) was used as a solution (6) for forming the layer A.

Preparation Example 6 of Solution for Forming
Layer A

First, 32.1 g of a biphenyl-type epoxy resin (YX4000H, manufactured by Japan Epoxy Resin Co., Ltd.), 17.9 g of bis[4-(3-aminophenoxy)phenyl]sulfone, which is a diamine, (manufactured by Wakayama Seika Kogyo Co., Ltd.), and 0.2 g of 2,4-diamino-6-[2'-undecylimidazolyl-(1')]-ethyl-s-triazine, which is an epoxy curing agent, (manufactured by Shikoku Corp.) were dissolved in dioxolane to obtain a solution (7). The solid content in the solution was set to 50 percent by weight. Then, 90 g of the solution (1) was mixed with 3 g of the solution (7) to obtain a solution (8) for forming the layer A.

Preparation Example 7 of Solution for Forming
Layer A

As shown in Table 4, 27 g of the solution (7) was mixed with 10 g of an epoxy-modified polybutadiene rubber (E1000-8, manufactured by Nippon Petrochemicals Co., Ltd.) to obtain a solution (9) for forming the layer A.

Preparation Example 1 of Layer B Solution

As shown in Table 3, 83 g of the solution (4), 50 g of the solution (7), and 7.5 g of silica (Admafine S0-C5, average particle size: 1.5 μm, manufactured by Tatsumori) were mixed to obtain a layer B solution (10).

C. Next, 10 g of acetic anhydride and 10 g of isoquinoline were added to 100 g of the polyamic acid solution, and the resulting mixture was uniformly stirred. Then, defoaming was performed. The resulting solution was flow-cast on a glass plate and dried at about 110° C. for about 5 minutes. The resulting polyamic acid film was separated from the glass plate to obtain a self-supporting gel film. The resulting gel film was fixed to a frame and was subjected to cyclodehydration and drying by heating at about 200° C. for about 1 minute, at about 300° C. for about 1 minute, at about 400° C. for about 1 minute, and at about 500° C. for about 1 minute. Thereby, a non-thermoplastic polyimide film (a) having a thickness of about 25 μm. The thermal expansion coefficient of this film was 12 ppm. As a result of thermomechanical analysis (TMA) in a compression mode (probe diameter: 3 mm, load: 5 g) in the range of 10° C. to 400° C. (heating rate: 10° C./min), permanent compressive deformation did not occur; hence, the resulting film was determined as a non-thermoplastic polyimide. The surface roughness Ra of the resulting non-thermoplastic polyimide film was 0.01 μm.

Example 1

The solution for forming the layer A shown in Table 3 was flow-cast onto a surface of a resin film (trade name; Cerapeel HP, surface roughness Ra: 0.02 μm, manufactured by Toyo Metallizing Co., Ltd.) to be a support. The flow-cast solution was dried at 60° C., 100° C., and 150° C. for 1 minute each

TABLE 3

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Solution for Forming Layer A | (1) | (2) | (3) | (5) | (6) | (8) | (1) | (1) |
| Solution for Forming Layer B | None | None | None | None | None | None | (10) | (10) |
| Polymer Film C | None | None | None | None | None | None | None | (a) |
| Strength in normal State | 11 N/cm | 11 N/cm | 8 N/cm | 10 N/cm | 7 N/cm | 9 N/cm | 11 N/cm | 11 N/cm |
| Post-PCT Adhesion Strength | 8 N/cm | 6 N/cm | 6 N/cm | 7 N/cm | 4 N/cm | 7 N/cm | 8 N/cm | 8 N/cm |
| Surface Roughness Ra | 0.02 μm | 0.02 μm | 0.02 μm | 0.02 μm | 0.10 μm | 0.02 μm | 0.02 μm | 0.02 μm |

Manufacture Example 1 of Non-thermoplastic
Polyimide Film

As a polymeric film, a non-thermoplastic polyimide film having a thickness of 25 μm was prepared and used. In a separable flask, 1 equivalent of p-phenylenediamine (hereinafter referred to as "PDA") and 1 equivalent of 4,4'-diaminodiphenyl ether (hereinafter referred to as "ODA") were dissolved in DMF, and 1 equivalent of p-phenylenebis (trimellitic acid monoester anhydride) (hereinafter referred to as "TMHQ") was added thereto. The resulting mixture was stirred for 30 minutes. Then, 0.9 equivalent of pyromellitic dianhydride (hereinafter referred to as "PMDA") was added thereto. The resulting mixture was stirred for 30 minutes. While monitoring an increase in viscosity, a DMF solution of PMDA (concentration: 7%) was carefully added such that the viscosity was 2,000 to 3,000 poise at 23° C. Thereby, a DMF solution of a polyamic acid polymer was obtained. The amount of DMF used was determined such that the content of the monomers fed was 18 percent by weight, the monomers being the diamine components and the tetracarboxylic dianhydride components. Polymerization was performed at 40° with a hot-air oven to obtain an insulating sheet including the layer A 25 μm in thickness on the support. The resulting sheet was evaluated according to evaluation procedures of various evaluation items. Table 3 shows the evaluation results.

Examples 2 to 6

Insulating sheets each including the layer A on a support were produced using the respective layer A-forming solutions shown in table 3 by the same procedure as that in Example 1. The resulting sheets were evaluated according to the evaluation procedures of various evaluation items. Table 3 shows the evaluation results.

Example 7

The solution for forming the layer A shown in Table 3 was flow-cast onto a surface of a resin film (trade name; Cerapeel HP, surface roughness Ra: 0.02 μm, manufactured by Toyo Metallizing Co., Ltd.) to be a support. The flow-cast solution was then dried at 60° C. for 1 minute with a hot-air oven to obtain an insulating sheet including the layer A 5 μm in thickness on the support.

Subsequently, the outermost layer B solution shown in Table 3 was flow-cast onto the layer A. The flow-cast solution was dried at 80° C., 100° C., 120° C., 140° C., and 150° C. for 1 minute each with a hot-air oven. Thereby, an insulating sheet including the layer A, the layer B, and the support was obtained, the sum of the thicknesses of the layer A and the layer B being 40 µm. The resulting sheet was evaluated according to evaluation procedures of various evaluation items. Table 3 shows the evaluation results.

Example 8

The solution for forming the layer A shown in Table 3 was flow-cast onto the polyimide film (a) 25 µm in thickness. The flow-cast solution was dried at 60° C. for 1 minute with a hot-air oven to obtain a polyimide film including the layer A 5 µm in thickness.

Subsequently, the outermost layer B solution shown in Table 3 was flow-cast onto the polyimide film surface that was opposite to the layer A. The flow-cast solution was dried at 80° C., 100° C., 120° C., 150° C., and 170° C. for 1 minute each with a hot-air oven. Thereby, an insulating sheet including a 5-µm thick surface A/25-µm thick polyimide film/35-µm thick layer B structure was obtained. The resulting sheet was evaluated according to evaluation procedures of various evaluation items. Table 3 shows the evaluation results.

Comparative Example 1

The same procedure as that in Example 1 was performed except that the solution (9) was used and desmearing was not performed. Evaluations were performed according to evaluation procedures of various evaluation items. Table 4 shows the evaluation results. As is clear from Table 4, the surface roughness is adequately small, but the adhesion strength is low.

TABLE 4

|  | Com. Ex. 1 | Com. Ex. 2 |
|---|---|---|
| Film | (9) | (9) |
| Desmearing Step | None | Performed |
| Strength in normal state | 1 N/cm | 6 N/cm |
| Post-PCT Adhesion Strength | 0.2 N/cm | 3 N/cm |
| Surface Roughness Ra | 0.1 µm | 1.5 µm |

Comparative Example 2

The same procedure as that in Comparative Example 1 was performed using the solution (9) except that desmearing was performed. Evaluations were performed according to evaluation procedures of various evaluation items. Table 4 shows the evaluation results. As is clear from Table 4, the adhesion strength is high, but the surface roughness is large.

Next, in the following Examples 9 to 14 and Comparative Examples 3 and 4, adhesion to an electroless copper plating film, surface roughness Ra, thermal expansion coefficient, laminatability, and the formability of fine lines were evaluated or calculated as described below.

[Evaluation of Adhesion]

The outermost layer B of an insulating sheet including a support was allowed to face a glass epoxy substrate FR-4 (product ID: MCL-E-67, manufactured by Hitachi Chemical Co., Ltd.; thickness of copper foil: 50 µm, total thickness: 1.2 mm), and heat and pressure were applied for 6 minutes at a temperature of 170° C. and a pressure of 1 MPa under vacuum. Then, the support was separated. Drying was performed at 180° C. for 60 minutes with a hot-air oven to obtain a laminate. Then, a copper layer was formed on the exposed surface of the outermost layer A. With respect to the formation of the copper layer, after desmearing and electroless copper plating were performed, an electroplating copper layer having a thickness of 18 µm was formed on the resulting electroless plating copper layer. After drying at 180° C. for 30 minutes, adhesion strength was measured in a normal state and after a pressure cooker test (PCT) according to JPCA-BU01-1998 (issued by Japan Electronics Packaging and Circuits Association). Desmearing and electroless copper plating were performed by the same processes as those in Example 1.

Adhesion strength in normal state: adhesion strength measured after left to stand for 24 hours at a temperature of 25° C. and a humidity of 50%.

PCT: adhesion strength measured after left to stand for 96 hours at a temperature of 121° C. and a humidity of 100%.

[Measurement of Surface Roughness Ra]

Measurement was performed by the same process as that in Example 1.

[Thermal Expansion Coefficient]

An insulating adhesive sheet was obtained by removing a support from an insulating adhesive sheet including the support. The insulating adhesive sheet was interposed between glossy surfaces of rolled copper foils (BHY-22B-T, manufactured by Nikko Materials Co., Ltd.; thickness: 18 µm), and heat and pressure were applied for 60 minutes at a temperature of 180° C. and a pressure of 3 MPa under vacuum to produce a laminate including copper foil/sheet/copper foil. The copper foils on both surfaces of the resulting laminate were removed using a hydrochloric acid/ferric chloride-based etchant. Drying was performed at 60° C. for 30 minutes to prepare a cured sheet 37 µm in thickness. The thermal expansion coefficient of the cured sheet was measured under the following conditions.

(Measurement Condition)

Measurement apparatus: TMA120C (manufactured by SII nanotechnology Inc.)

Measurement direction of cured sheet: MD direction (longitudinal direction)

Load: 3 g

Heating rate: 10° C./min

First scan condition (annealing): Room temperature to glass transition temperature+10° C.

Second scan condition: −70° C. to 300° C.

Method for calculating thermal expansion coefficient: Average expansion coefficient between −55° C. and 125° C. was defined as thermal expansion coefficient Here, the term "glass transition temperature" in the first scan condition means the peak temperature of tan δ obtained from the measurement of dynamic viscoelasticity under the following conditions (Measurement Condition for Dynamic Viscoelasticity)

Measurement apparatus: DMS6100 (manufactured by SII nanotechnology Inc.)

Measurement direction of cured sheet: MD direction

Heating rate: 10° C./min

Scan condition: Room temperature to 300° C.

Method for calculating glass transition temperature: Peak temperature of tan δ was defined as glass transition temperature

[Evaluation of Laminatability]

The layer B of an insulating sheet including a support was allowed to face a circuit-forming surface of a glass epoxy substrate FR-4 (product ID: MCL-E-67, manufactured by Hitachi Chemical Co., Ltd.; thickness of copper foil: 50 μm, total thickness: 1.2 mm) having a circuit with a height of 18 μm, a circuit width of 50 μm, and a circuit spacing of 50 μm, and heat and pressure were applied for 6 minutes at a temperature of 170° C. and a pressure of 1 MPa under vacuum. Then, the support was removed by peeling. Drying was performed at 180° C. for 60 minutes with a hot-air oven to produce a laminate. The exposed surface of the resin was visually observed using an optical microscope (magnification: 50 times) to check whether or not bubbles were included in the space between the circuits. Laminatability was evaluated according to the following criteria:

Pass (P): No inclusion of bubbles was observed in the space between the circuits (in other words, no portion in which the resin does not enter was observed in the space between the circuits).

Failure (F): Inclusion of bubbles was observed.

[Formability of Fine Lines]

The layer B of an insulating sheet including a support was allowed to face a circuit-forming surface of a glass epoxy substrate FR-4 (product ID: MCL-E-67, manufactured by Hitachi Chemical Co., Ltd.; thickness of copper foil: 50 μm, total thickness: 1.2 mm) having a circuit with a height of 18 μm, a circuit width of 50 μm, and a circuit spacing of 50 μm, and heat and pressure were applied for 6 minutes at a temperature of 170° C. and a pressure of 1 MPa under vacuum. Then, the support was removed by peeling. Drying was performed at 180° C. for 60 minutes with a hot-air oven to produce a laminate. Next, a via hole having an inner diameter of 30 μm and reaching the electrode of the FR-4 serving as an inner layer was provided at a position directly above the electrode by a UV-YAG laser. Subsequently, the entire surface of the substrate was subjected to electroless copper plating and then heated at 180° C. for 30 minutes. A resist pattern was formed on the resulting copper plating layer. Electroplating copper film having a thickness of 10 μm was formed. Then, the resist pattern was separated, and the exposed plating copper was removed with a sulfuric acid/hydrogen peroxide-based etchant. Thereby, a printed circuit board having lines with a line and space (L/S)=10 μm/10 μm was produced. Formability of the lines on the printed circuit board was evaluated according to the following criteria:

Pass (P): The lines were satisfactory produced without a break and a defective shape.

Failure (F): A break or a defective shape occurred.

Synthesis Example 5 of Polyimide Resin

A KF-8010 (62 g, 0.075 mol) (manufactured by Shin-Etsu Chemical Co., Ltd.), 4,4'-diaminodiphenyl ether (15 g, 0.075 mol), and N,N-dimethylformamide (hereinafter referred to as "DMF") were fed into a 2,000-mL glass flask and dissolved under stirring. Then, 4,4'-(4,4'-isopropylidenediphenoxy)bis (phthalic anhydride) (78 g, 0.15 mol) was added thereto. The resulting mixture was stirred for about 1 hour to prepare a DMF solution of a polyamic acid having a solid content of 30%. The resulting polyamic acid solution was transferred to a vat coated with Teflon (registered trademark) and heated in a vacuum oven at 200° C. for 120 minutes under a reduced pressure of 665 Pa to obtain a polyimide resin 5.

Synthesis Example 6 of Polyimide Resin

A KF-8010 (37 g, 0.05 mol) (manufactured by Shin-Etsu Chemical Co., Ltd.), 4,4'-diaminodiphenyl ether (21 g, 0.10 mol), and DMF were fed into a 2,000-mL glass flask and dissolved under stirring. Then, 4,4'-(4,4'-isopropylidenediphenoxy)bis(phthalic anhydride) (78 g, 0.15 mol) was added thereto. The resulting mixture was stirred for about 1 hour to prepare a DMF solution of a polyamic acid having a solid content of 30%. The resulting polyamic acid solution was transferred to a vat coated with Teflon (registered trademark) and heated in a vacuum oven at 200° C. for 120 minutes under a reduced pressure of 665 Pa to obtain a polyimide resin 6.

Synthesis Example 7 of Polyimide Resin

Into a 2,000-mL glass flask, 1,3-bis(3-aminophenoxy)benzene (41 g, 0.143 mol), 3,3'-dihydroxy-4,4'-diaminobiphenyl (1.6 g, 0.007 mol), and DMF were fed and dissolved under stirring. Then, 4,4'-(4,4'-isopropylidenediphenoxy)bis(phthalic anhydride) (78 g, 0.15 mol) was added thereto. The resulting mixture was stirred for about 1 hour to prepare a DMF solution of a polyamic acid having a solid content of 30%. The resulting polyamic acid solution was transferred to a vat coated with Teflon (registered trademark) and heated in a vacuum oven at 200° C. for 180 minutes under a reduced pressure of 665 Pa to obtain a polyimide resin 7.

Preparation Example 8 of Solution for Forming Layer A

The polyimide resin 5 was dissolved in dioxolane to prepare a solution (11) for forming the layer A. The solid content was set to 15 percent by weight.

Preparation Example 9 of Solution for Forming Layer A

The polyimide resin 6 was dissolved in dioxolane to prepare a solution (12) for forming the layer A. The solid content was set to 15 percent by weight.

Preparation Example 10 of Solution for Forming Layer A

The polyimide resin 7 was dissolved in dioxolane to prepare a solution (13). The solid content was set to 20 percent by weight. A polyimide silicone solution X-22-8951 (manufactured by Shin-Etsu Chemical Co., Ltd.; solid content: 30 percent by weight, methyl isobutyl ketone solution) was used as a solution (14) for forming the layer A. Furthermore, 30 g of the solution (13) was missed with 70 g of the solution (14) to obtain a solution (15) for forming the layer A.

Preparation Example 11 of Solution for Forming Layer A

First, 32.1 g of a biphenyl-type epoxy resin (YX4000H, manufactured by Japan Epoxy Resin Co., Ltd.), 17.9 g of bis[4-(3-aminophenoxy)phenyl]sulfone, which is a diamine, (manufactured by Wakayama Seika Kogyo Co., Ltd.), and 0.2 g of 2,4-diamino-6-[2'-undecylimidazolyl-(1')]-ethyl-s-triazine, which is an epoxy curing agent, (manufactured by Shikoku Corp.) were dissolved in dioxolane to obtain a solution (16) having a solid content of 50%. Then, 60 g of the solution (11) was mixed with 6 g of the solution (16) to obtain a solution (17) for forming the layer A.

Preparation Example 2 of Layer B Solution

Here, 50 g of the solution (13), 20 g of the solution (16), and 10 g of silica (Admafine S0-C5, average particle size: 1.5 μm, manufactured by Tatsumori) were mixed to obtain a solution (18) for forming the layer B.

Preparation Example 3 of Layer B Solution

A thermoplastic polyimide resin (ULTEM 1000-1000, manufactured by General Electric Company) was dissolved in dioxolane to obtain solution (19). The solid content was set to 20 percent by weight. Then, 50 g of the solution (19), 20 g of the solution (16), and 10 g of silica (Admafine S0-C5, average particle size: 1.5 μm, manufactured by Tatsumori) were mixed to obtain a solution (20) for forming the layer B.

Preparation Example 4 of Layer B Solution

A phenoxy resin (YP-50, manufactured by Tohto Kasei Co., Ltd.) was dissolved in dioxolane to obtain a 20 percent by weight solution (21). Then, 50 g of the solution (21), 40 g of the solution (16), 20 g of silica (Admafine S0-C5, average particle size: 1.5 μm, manufactured by Tatsumori) were mixed to obtain a solution (22) for forming the layer B.

Example 9

The solution for forming the layer A shown in Table 5 was flow-cast onto a surface of a resin film (trade name; Cerapeel HP, surface roughness Ra: 0.01 μm, manufactured by Toyo Metallizing Co., Ltd.) to be a support. The flow-cast solution was dried at 60° C. for 1 minute with a hot-air oven to obtain an insulating sheet including the 2-μm thick layer A/the support. Furthermore, a solution for forming the layer B was flow-cast onto the surface of the layer A in the component of the layer A/the support. The flow-cast solution was dried at 60° C., 100° C., 120° C., and 150° C. for 1 minute each. Thereby, a support-containing insulating sheet including a 35-μm thick layer B/the 2-μm thick layer A/the support was obtained. The sheet was evaluated according to evaluation procedures of various evaluation items. Table 5 shows the evaluation results.

Examples 10 to 14

Insulating sheets each including the layer A/the layer B were obtained using the respective layer A-forming solutions shown in Table 5 by the same procedure as that in Example 9. The resulting sheets were evaluated according to the evaluation procedures of various evaluation items. Table 5 shows the evaluation results.

Comparative Example 3

The solution (22) was flow-cast onto a surface of a resin film (trade name; Cerapeel HP, manufactured by Toyo Metallizing Co., Ltd.) to be a support. The flow-cast solution was dried at 60° C., 100° C., 120° C., and 150° C. for 1 minute each with a hot-air oven to produce an insulating sheet consisting of the 35-μm thick layer B alone. The resulting film was evaluated according to evaluation procedures of various evaluation items. As is clear from Table 6, the thermal expansion coefficient was small, the inner circuit could be adequately embedded, and surface roughness was small. However, fine lines could not be satisfactorily formed because of low adhesion strength to an electroless-plating film.

Comparative Example 4

An insulating sheet consisting of the layer A having a thickness of 35 μm was produced using the solution (14), and the resulting film was evaluated according to evaluation procedures of various evaluation items. As is clear from Table 6, although the surface roughness was small, adhesion to an electroless-plating film was high. However, the inner circuit was unsatisfactorily embedded, and the thermal expansion coefficient was also large.

TABLE 5

|  | Ex. 9 | Ex. 10 | Ex. 11 | Ex. 12 | Ex. 13 | Ex. 14 |
| --- | --- | --- | --- | --- | --- | --- |
| Solution for forming Layer A | (11) | (12) | (15) | (17) | (11) | (11) |
| Solution for forming Layer B | (18) | (18) | (18) | (18) | (20) | (22) |
| Thermal Expansion Coefficient | 62 ppm | 62 ppm | 62 ppm | 62 ppm | 58 ppm | 67 ppm |
| Strength in Normal State | 11 N/cm | 11 N/cm | 8 N/cm | 8 N/cm | 10 N/cm | 9 N/cm |
| Post-PCT Adhesion Strength | 8 N/cm | 6 N/cm | 6 N/cm | 5 N/cm | 8 N/cm | 5 N/cm |
| Surface Roughness Ra | 0.02 μm | 0.01 μm | 0.07 μm | 0.10 μm | 0.02 μm | 0.02 μm |
| Circuit Burying Property | P | P | P | P | P | P |
| Fine Wiring Formation Property L/S = 10 μm/10 μm | P | P | P | P | P | P |

TABLE 6

|  | Com. Ex. 3 | Com. Ex. 4 | Ref. Ex. 1 |
| --- | --- | --- | --- |
| Solution for forming Layer A | None | (14) | (8) |
| Solution for forming Layer B | (1) | None | None |
| Thermal Expansion Coefficient | 66 ppm | 217 ppm | 142 ppm |
| Strength in Normal State | 1 N/cm | 7 N/cm | 9 N/cm |
| Post-PCT Adhesion Strength | 0.1 N/cm | 4 N/cm | 7 N/cm |
| Surface Roughness Ra | 0.02 μm | 0.02 μm | 0.02 μm |
| Circuit Burying Property | P | F | P |
| Fine Wiring Formation Property L/S = 10 μm/10 μm | F (Wire Peel was observed) | P | P |

Reference Example 1

The solution (8) for forming the layer A used in Example 6 was flow-cast onto a surface of a resin film (trade name: Cerapeel HP, surface roughness Ra: 0.02 μm, manufactured by Toyo Metallizing Co., Ltd.) to be a support. Then, the flow-cast solution was dried by heating at 60° C., 100° C., and 150° C. for 1 minute each with a hot-air oven to obtain an insulating sheet having the layer A 25 μm in thickness on the support. The resulting sheet was evaluated according to evaluation procedures of various evaluation items. Table 6 shows the evaluation results.

In each of the following Examples 15 to 19 and Comparative Examples 5 and 6, adhesion to an electroless copper plating film, surface roughness Ra, the determination of a thermoplastic polyimide, a thermal expansion coefficient, and the formability of fine lines were evaluated or calculated as described below.

[Evaluation of Adhesion]

An insulating sheet was placed on a glass epoxy substrate FR-4 (product ID: MCL-E-67, manufactured by Hitachi Chemical Co., Ltd.; thickness of copper foil: 50 μm, total thickness: 1.2 mm) with an interlayer adhesive film therebetween, and heat and pressure were applied for 6 minutes at a temperature of 170° C. and a pressure of 1 MPa under vacuum. Then, drying was performed at 180° C. for 60 minutes to obtain a laminate. When an insulating sheet has a layer A/polymeric film layer C structure, the polymeric film side was allowed to face an interlayer adhesive film, and heat and pressure were applied. In the case of an insulating sheet having a layer A/polymeric film layer C/layer A' structure, an interlayer adhesive film was not used. Then, a copper layer was formed on the exposed surface of the layer A. With respect to the formation of the copper layer, after desmearing and electroless copper plating were performed, an electroplating copper layer having a thickness of 18 μm was formed on the resulting electroless plating copper layer. After drying at 180° C. for 30 minutes, adhesion strength was measured in a normal state and after a pressure cooker test (PCT) according to JPCA-BU01-1998 (issued by Japan Electronics Packaging and Circuits Association). Desmearing and electroless copper plating were performed by the same processes as those in Example 1.

Adhesion strength in normal state: adhesion strength measured after left to stand for 24 hours at a temperature of 25° C. and a humidity of 50%.

PCT: adhesion strength measured after left to stand for 96 hours at a temperature of 121° C. and a humidity of 100%.

[Measurement of Surface Roughness Ra]

Measurement was performed by the same process as that in Example 1.

[Determination of Thermoplastic Polyimide]

A layer A solution for was applied onto a resin film (trade name; Cerapeel HP, surface roughness Ra: 0.01 μm, manufactured by Toyo Metallizing Co., Ltd.) to be a support. The applied solution was dried at 60° C. and 100° C. for 1 minute each with a hot-air oven to produce a 25-μm thick layer A on the support. Then, the support was separated. The layer A was fixed to an aluminum frame and dried at 180° C. for 1 hour to obtain a 25-μm thick layer A. The permanent compressive deformation of the resulting layer A was investigated by thermomechanical analysis (TMA) in a compression mode (probe diameter: 3 mm, load: 5 g) in the range of 10° C. to 400° C. (heating rate: 10° C./min). A sample in which permanent compressive deformation occurred was determined as a thermoplastic polyimide. Here, a TMA120C (manufactured by SII nanotechnology Inc.) was used as a measurement apparatus.

[Thermal Expansion Coefficient]

An insulating sheet having a layer A/polymeric film layer C structure or an insulating sheet having a layer A/polymeric film layer C/layer A structure was heated and cooled between room temperature and 300° C. at a heating rate of 10° C./min under nitrogen stream. The cycle of heating and cooling was repeated twice. Thermal expansion coefficient was determined by measuring the mean linear expansion coefficient between 100° C. to 200° C. in the second heating cycle. A TMA120C (manufactured by SII nanotechnology Inc.) was used as a measurement apparatus.

[Formability of Fine Line]

A laminate including an insulating sheet/interlayer adhesive film/FR-4 structure or a laminate including an insulating sheet/FR-4 structure was obtained by the same process as that described in section "Evaluation of adhesion". Next, a via hole having an inner diameter of 30 μm and reaching the electrode of the FR-4 serving as an inner layer was provided at a position directly above the electrode using a UV-YAG laser. Subsequently, the entire surface of the substrate was subjected to electroless copper plating and then heated at 180° C. for 30 minutes. A resist pattern was formed on the resulting copper plating layer. Electroplating copper film having a thickness of 10 μm was formed. Then, the resist pattern was separated, and the exposed plating copper was removed with a hydrochloric acid/ferric chloride-based etchant. Thereby, a printed circuit board having lines with a line and space (L/S)=10 μm/10 μm was produced. Formability of the lines in the printed circuit board was evaluated according to the following criteria:

Pass (P): The lines were satisfactory produced without a break and a defective shape.

Failure (F): A break or a defective shape occurred.

Synthesis Example 8 of Polyimide Resin

A KF-8010 (37 g, 0.05 mol) (manufactured by Shin-Etsu Chemical Co., Ltd.), 4,4'-diaminodiphenyl ether (21 g, 0.10 mol), and DMF were fed into a 2,000-mL glass flask and dissolved under stirring. Then, 4,4'-(4,4'-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated with a hot-air oven at 200° C. for 120 minutes under a reduced pressure of 665 Pa to obtain a polyimide resin 8.

Synthesis Example 9 of Polyimide Resin

A KF-8010 (62 g, 0.075 mol) (manufactured by Shin-Etsu Chemical Co., Ltd.), 4,4'-diaminodiphenyl ether (15 g, 0.075 mol), and N,N-dimethylformamide (hereinafter referred to as "DMF") were fed into a 2,000-mL glass flask and dissolved under stirring. Then, 4,4'-(4,4'-isopropylidenediphenoxy)bis (phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated with a hot-air oven at 200° C. for 120 minutes under a reduced pressure of 665 Pa to obtain a polyimide resin 9.

Synthesis Example 10 of Polyimide Resin

Into a 2,000-mL glass flask, 1,3-bis(3-aminophenoxy)benzene (41 g, 0.143 mol), 3,3'-dihydroxy-4,4'-diaminobiphenyl (1.6 g, 0.007 mol), and DMF were fed and dissolved under stirring. Then, 4,4'-(4,4'-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated with a hot-air oven at 200° C. for 180 minutes under a reduced pressure of 665 Pa to obtain a polyimide resin 10.

Preparation Example 12 of Solution for Forming Layer A

The polyimide resin 8 was dissolved in dioxolane to prepare a solution (23) for forming the layer A. The solid content was set to 15 percent by weight.

Preparation Example 13 of Solution for Forming Layer A

The polyimide resin 9 was dissolved in dioxolane to prepare a solution (24) for forming the layer A. The solid content was set to 15 percent by weight.

Preparation Example 14 of Solution for Forming Layer A

First, 32.1 g of a biphenyl-type epoxy resin (YX4000H, manufactured by Japan Epoxy Resin Co., Ltd.), 17.9 g of bis[4-(3-aminophenoxy)phenyl]sulfone, which is a diamine, (manufactured by Wakayama Seika Kogyo Co., Ltd.), and 0.2 g of 2,4-diamino-6-[2'-undecylimidazolyl-(1')]-ethyl-s-triazine, which is an epoxy curing agent, (manufactured by Shikoku Corp.) were dissolved in dioxolane to obtain a solution (25) having a solid content of 15%. Then, 70 g of the solution (23) was mixed with 30 g of the solution (25) to obtain a solution (26) for forming the layer A.

Preparation Example 15 of Solution for Forming Layer A

A polyimide silicone solution (X-22-8917 (solid content: 20 percent by weight, cyclohexanone solution), manufactured by Shin-Etsu Chemical Co., Ltd.) was used as a solution (27) for forming the layer A. Next, 32.1 g of a biphenyl-type epoxy resin (YX4000H, manufactured by Japan Epoxy Resin Co., Ltd.), 17.9 g of bis[4-(3-aminophenoxy)phenyl]sulfone, which is a diamine, (manufactured by Wakayama Seika Kogyo Co., Ltd.), and 0.2 g of 2,4-diamino-6-[2'-undecylimidazolyl-(1')]-ethyl-s-triazine, which is an epoxy curing agent, (manufactured by Shikoku Corp.) were dissolved in cyclohexanone to obtain a solution (28) having a solid content of 20%. Furthermore, 70 g of the solution (27) was mixed with 30 g of the solution (28) to obtain a solution (29) for forming the layer A.

Manufacture Example 2 of Non-thermoplastic Polyimide Film

As a polymeric film, a non-thermoplastic polyimide film having a thickness of 25 μm was prepared and used. In a separable flask, 1 equivalent of p-phenylenediamine (hereinafter referred to as "PDA") and 1 equivalent of 4,4'-diaminodiphenyl ether (hereinafter referred to as "ODA") were dissolved in DMF, and 1 equivalent of p-phenylenebis (trimellitic acid monoester anhydride) (hereinafter referred to as "TMHQ") was added thereto. The resulting mixture was stirred for 30 minutes. Then, 0.9 equivalent of pyromellitic dianhydride (hereinafter referred to as "PMDA") was added thereto. The resulting mixture was stirred for 30 minutes. While monitoring an increase in viscosity, a DMF solution of PMDA (concentration: 7%) was carefully added such that the viscosity was 2,000 to 3,000 poise at 23° C. Thereby, a DMF solution of a polyamic acid polymer was obtained. The amount of DMF used was determined such that the content of the monomers fed was 18 percent by weight, the monomers being the diamine components and the tetracarboxylic dianhydride components. Polymerization was performed at 40° C. Next, 10 g of acetic anhydride and 10 g of isoquinoline were added to 100 g of the polyamic acid solution, and the resulting mixture was uniformly stirred. Then, defoaming was performed. The resulting solution was flow-cast on a glass plate and dried at about 110° C. for about 5 minutes. The resulting polyamic acid film was separated from the glass plate to obtain a self-supporting gel film. The resulting gel film was fixed to a frame and was subjected to cyclodehydration and drying by heating at about 200° C. for about 1 minute, at about 300° C. for about 1 minute, at about 400° C. for about 1 minute, and at about 500° C. for about 1 minute. Thereby, a non-thermoplastic polyimide film (b) having a thickness of about 25 μm. The thermal expansion coefficient of this film was 12 ppm. As a result of thermomechanical analysis (TMA) in a compression mode (probe diameter: 3 mm, load: 5 g) in the range of 10° C. to 400° C. (heating rate: 10° C./min), permanent compressive deformation did not occur; hence, the resulting film was determined as a non-thermoplastic polyimide. The surface roughness Ra of the resulting non-thermoplastic polyimide film was 0.01 μm.

Manufacture Example 1 of Interlayer Adhesive Film

First, the polyimide resin 10 was dissolved in dioxolane to obtain a solution (30). The solid content was set to 20 percent by weight. Next, 32.1 g of a biphenyl-type epoxy resin (YX4000H, manufactured by Japan Epoxy Resin Co., Ltd.), 17.9 g of bis[4-(3-aminophenoxy)phenyl]sulfone, which is a diamine, (manufactured by Wakayama Seika Kogyo Co., Ltd.), and 0.2 g of 2,4-diamino-6-[2'-undecylimidazolyl-(1')]-ethyl-s-triazine, which is an epoxy curing agent, (manufactured by Shikoku Corp.) were dissolved in dioxolane to obtain a solution (31) having a solid content of 50%. Then, 40 g of the solution (30), 16 g of the solution (31), and 8 g of silica (Admafine S0-C5, average particle size: 1.5 μm, manufactured by Tatsumori) were mixed to obtain a solution (32). The solution (32) was flow-cast onto a surface of a resin film (trade name: Cerapeel HP, manufactured by Toyo Metallizing Co., Ltd.) to be a support. The flow-cast solution was dried at 60° C., 100° C., 120° C., and 150° C. with a hot-air oven to produce an interlayer adhesive film (I) 35 μm in thickness. When lamination was performed using the resulting interlayer adhesive film, the interlayer adhesive film in which the resin film was removed was used.

Example 15

The solution for forming the layer A shown in Table 7 was flow-cast onto a surface of a non-thermoplastic polyimide film, and the flow-cast solution was dried at 150° C. with a hot-air oven to produce an insulating sheet including a 2-μm thick layer A/25-μm thick non-thermoplastic polyimide film structure. The resulting insulating sheet was evaluated according to the evaluation procedures of various evaluation items. Table 7 shows the evaluation results.

Examples 16 to 18

Insulating sheets were produced using the respective layer A-forming solutions shown in Table 7 by the same procedure as that in Example 15. The resulting laminates were evaluated according to the evaluation procedures of various evaluation items. Table 7 shows the evaluation results.

Examples 19

The solution for forming the layer A shown in Table 7 was flow-cast onto one surface of a non-thermoplastic polyimide film, and the flow-cast solution was dried at 150° C. with a hot-air oven to produce an insulating sheet including a 2-μm thick layer A/25-μm thick non-thermoplastic polyimide film structure. Next, the solution for forming the layer A was also flow-cast onto the other surface of the non-thermoplastic polyimide film of the insulating sheet, and the flow-cast solution was dried at 150° C. with a hot-air oven to produce an insulating sheet including a 2-μm thick layer A/25-μm thick non-thermoplastic polyimide film/2-μm thick layer A structure. The resulting insulating sheet was evaluated according to the evaluation procedures of various evaluation items. Table 7 shows the evaluation results.

Comparative Example 5

The solution (25) was flow-cast on a surface of a resin film (trade name; Cerapeel HP, manufactured by Toyo Metallizing Co., Ltd.), and the flow-cast solution was dried at 60° C., 100° C., 120° C., and 150° C. with a hot-air oven to produce an insulating sheet having a thickness of 35 μm. The resulting film was evaluated according to the evaluation procedures of various evaluation items. Table 8 shows the evaluation results. As is clear from Table 8, the thermal expansion coefficient was large. Furthermore, when fine lines were formed, the separation of lines occurred because of low adhesion strength to an electroless-plating film.

Comparative Example 6

A laminate including a 2-μm thick layer A/25-μm thick non-thermoplastic polyimide film structure was produced as in Example 15 except that the layer A was formed using the solution (25). The resulting laminate was evaluated according to the evaluation procedures of various evaluation items. Table 8 shows the evaluation results. As is clear from Table 8, although the thermal expansion coefficient of the laminate was small, when fine lines were formed, the separation of lines occurred because of low adhesion strength to an electroless-plating film.

In the following Examples 20 to 30, Comparative Examples 7 and 8, and Reference Example, adhesion to electroless-plating copper, surface roughness Ra, and laminatability were evaluated or calculated as described below.

(Manufacture 3 of Non-Thermoplastic Polyimide Film)

A polyamic acid was prepared using pyromellitic dianhydride/p-phenylenebis(trimellitic acid monoester anhydride)/p-phenylenediamine/4,4'-diaminodiphenyl ether in the molar ratio of 1/1/1/1. A converter containing 17 g of acetic anhydride and 2 g of isoquinoline was added to 90 g of a 17% by weight solution of polyamic acid in N,N-dimethylacetamide, and the resulting mixture was stirred. After defoaming by centrifugation, the resulting mixture was flow-cast onto an aluminum foil in a manner such that the resulting flow-cast solution has a thickness of 150 μm. Stirring and defoaming were performed at 0° C. The resulting laminate including the aluminum foil and the polyamic acid solution was heated at 110° C. for 4 minutes to produce a self-supporting gel film. The content of volatile components remaining in this gel film was 30 percent by weight, and the imidization ratio was 90%. This gel film was separated from the aluminum foil and fixed to a frame. This gel film was heated to 300° C., 400° C., and 500° C. for 1 minute each to produce a non-thermoplastic polyimide film (c) having a thickness of 13 μm. The mean coefficient of linear expansion of the resulting non-thermoplastic polyimide film was 12 ppm between 100° C. and 200° C., and the tensile modulus was 6 GPa at room temperature. The surface roughness Ra of the resulting non-thermoplastic polyimide film was 0.01 μm.

Synthesis Example 11 of Polyimide Resin

A KF-8010 (124.7 g, 0.15 mol) (manufactured by Shin-Etsu Chemical Co., Ltd.) and N,N-dimethylformamide (hereinafter referred to as "DMF") were fed into a 2,000-mL glass

TABLE 7

| | Ex. 15 | Ex. 16 | Ex. 17 | Ex. 18 | Ex. 19 |
|---|---|---|---|---|---|
| Solution For layer A | (23) | (24) | (26) | (29) | (23) |
| Layer A (and another Layer A) was Thermoplastic Polyimide or not | yes | yes | yes | yes | yes for both layers |
| Polymer Film | (b) | (b) | (b) | (b) | (b) |
| Insulating Sheet Configuration | Layer A/ (b) | Layer A/ (b) | Layer A/ (b) | Layer A/ (b) | Layer A/ (b)/ Layer A' |
| Interlayer Adhesion Film | (I) | (I) | (I) | (I) | (I) |
| Thermal Expansion Sheet of Insulating Sheet | 24 ppm | 31 ppm | 23 ppm | 28 ppm | 30 ppm |
| Strength in Normal State | 8 N/cm | 9 N/cm | 7 N/cm | 7 N/cm | 8 N/cm |
| Post-PCT Adhesion Strength | 5 N/cm | 6 N/cm | 5 N/cm | 5 N/cm | 5 N/cm |
| Surface Roughness Ra | 0.01 μm | 0.02 μm | 0.01 μm | 0.01 μm | 0.01 μm |
| Fine Wiring Formation Property L/S = 10 μm/10 μm | P | P | P | P | P |

TABLE 8

| | Com. Ex. 5 | Com. Ex. 6 |
|---|---|---|
| Solution For layer A | (25) | (25) |
| Polymer Film | None | (b) |
| Insulating Sheet Configuration | Layer A Only | Layer A/ (b) |
| Interlayer Adhesion Film | (I) | (I) |
| Thermal Expansion Sheet of Insulating Sheet | 80 ppm | 22 ppm |
| Strength in Normal State | 1 N/cm | 1 N/cm |
| Post-PCT Adhesion Strength | 0.1 N/cm | 0.1 N/cm |
| Surface Roughness Ra | 0.01 μm | 0.02 μm |
| Fine Wiring Formation Property L/S = 10 μm/10 μm | F (Wire Peel was observed) | F (Wire Peel was observed) | flask and dissolved under stirring. Then, 4,4'-(4,4'-isopropylidenediphenoxy)bis(phthalic anhydride) (78.1 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated at 200° C. for 120 minutes under a reduced pressure of 665 Pa to obtain a polyimide resin 11.

As a result of thermomechanical analysis (TMA, heating rate: 10° C./min) in a compression mode (probe diameter: 3 mm, load: 5 g) of the resulting polyimide resin (11), permanent compressive deformation was observed at 40° C. Therefore, it was found that the resulting polyimide resin (11) was thermoplastic.

The resulting polyimide resin (11) was dissolved in dioxolane. The resulting solution was flow-cast onto a PET film. The flow-cast solution was dried at 150° C. for 2 minutes to produce a polyimide film. The resulting polyimide film had a tensile modulus of 0.5 GPa.

Synthesis Example 12 of Polyimide Resin

A KF-8010 (62.3 g, 0.075 mol) (manufactured by Shin-Etsu Chemical Co., Ltd.), 4,4'-diaminodiphenyl ether (15.0 g, 0.075 mol), and DMF were fed into a 2,000-mL glass flask and dissolved under stirring. Then, 4,4'-(4,4'-isopropylidenediphenoxy)bis(phthalic anhydride) (78.1 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated at 200° C. for 120 minutes under a reduced pressure of 665 Pa to obtain a polyimide resin (12).

As a result of thermomechanical analysis (TMA, heating rate: 10° C./min) in a compression mode (probe diameter: 3 mm, load: 5 g) of the resulting polyimide resin (12), permanent compressive deformation was observed at 90° C. Therefore, it was found that the resulting polyimide resin (12) was thermoplastic.

The resulting polyimide resin (12) was dissolved in dioxolane. The resulting solution was flow-cast onto a PET film. The flow-cast solution was dried at 150° C. for 2 minutes to produce a polyimide film. The resulting polyimide film had a tensile modulus of 1.0 GPa.

Synthesis Example 13 of Polyimide Resin

A KF-8010 (37.4 g, 0.045 mol) (manufactured by Shin-Etsu Chemical Co., Ltd.), 4,4'-diaminodiphenyl ether (21.0 g, 0.105 mol), and DMF were fed into a 2,000-mL glass flask and dissolved under stirring. Then, 4,4'-(4,4'-isopropylidenediphenoxy)bis(phthalic anhydride) (78.1 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated at 200° C. for 120 minutes under a reduced pressure of 665 Pa to obtain a polyimide resin (13).

As a result of thermomechanical analysis (TMA, heating rate: 10° C./min) in a compression mode (probe diameter: 3 mm, load: 5 g) of the resulting polyimide resin (13), permanent compressive deformation was observed at 150° C. Therefore, it was found that the resulting polyimide resin (13) was thermoplastic.

The resulting polyimide resin (13) was dissolved in dioxolane. The resulting solution was flow-cast onto a PET film. The flow-cast solution was dried at 150° C. for 2 minutes to produce a polyimide film. The resulting polyimide film had a tensile modulus of 1.4 GPa.

Synthesis Example 14 of Polyimide Resin

A KF-8010 (37.4 g, 0.045 mol) (manufactured by Shin-Etsu Chemical Co., Ltd.), 1,3-bis(3-aminophenoxy)benzene (30.7 g, 0.105 mol), and DMF were fed into a 2,000-mL glass flask and dissolved under stirring. Then, 4,4'-(4,4'-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated at 200° C. for 120 minutes under a reduced pressure of 665 Pa to obtain a polyimide resin (14).

As a result of thermomechanical analysis (TMA, heating rate: 10° C./min) in a compression mode (probe diameter: 3 mm, load: 5 g) of the resulting polyimide resin (14), permanent compressive deformation was observed at 140° C. Therefore, it was found that the resulting polyimide resin (14) was thermoplastic.

The resulting polyimide resin (14) was dissolved in dioxolane. The resulting solution was flow-cast onto a PET film. The flow-cast solution was dried at 150° C. for 2 minutes to produce a polyimide film. The resulting polyimide film had a tensile modulus of 1.2 GPa.

Synthesis Example 15 of Polyimide Resin

Into a 2,000-mL glass flask, 1,3-bis(3-aminophenoxy)benzene (41 g, 0.15 mol) and DMF were fed and dissolved under stirring. Then, 4,4'-(4,4'-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated at 200° C. for 180 minutes under a reduced pressure of 665 Pa to obtain a polyimide resin (15).

As a result of thermomechanical analysis (TMA, heating rate: 10° C./min) in a compression mode (probe diameter: 3 mm, load: 5 g) of the resulting polyimide resin (15), permanent compressive deformation was observed at 160° C. Therefore, it was found that the resulting polyimide resin (15) was thermoplastic.

The resulting polyimide resin (15) was dissolved in dioxolane. The resulting solution was flow-cast onto a PET film. The flow-cast solution was dried at 150° C. for 2 minutes to produce a polyimide film. The resulting polyimide film had a tensile modulus of 2.0 GPa.

Preparation Examples 16 to 20 of Layer A-Forming Solutions

The resulting polyimide resins 11 to 15 were dissolved or dispersed in dioxolane to prepare the respective layer A-forming solutions 33 to 37. The solid contents were set to 15 percent by weight.

Preparation Example 5 of Solution for Forming Layer B

First, 50 g of the polyimide resin (15) obtained above, 32.1 g of a biphenyl-type epoxy resin (YX4060H, manufactured by Japan Epoxy Resin Co., Ltd.), 17.9 g of bis[4-(3-aminophenoxy)phenyl]sulfone, and 0.2 g of 2,4-diamino-6-[2'-undecylimidazolyl-(1')]-ethyl-s-triazine were dissolved in a mixed solution of dioxolane/toluene (7/3, weight ratio). Then, 50 g of a spherical fused silica filler having an average particle size of 1.5 μm and subjected to surface-treatment by a dry process with hexamethyldisilazane was dispersed therein to obtain a solution (38) for forming the layer B. The solid content was set to 30 percent by weight.

[Evaluation of Adhesion]

A fluorocarbon resin film (trade name: AFLEX, manufactured by Asahi Glass Co. Ltd., surface roughness Ra: 0.01 μm) serving as a protective film was provided on the layer B. The layer C was allowed to face a glass epoxy substrate (trade name: RISHOLITE CS-3665, manufactured by Risho Kogyo Co., Ltd., thickness of copper foil: 18 μm, total thickness: 0.6 mm), and heat and pressure were applied for 60 minutes at a temperature of 180° C. and a pressure of 3 MPa under vacuum. Then, the fluorocarbon resin film was separated to obtain a laminate including an insulating sheet/glass epoxy substrate structure.

Next, a copper layer was formed on the exposed surface of the layer A. With respect to the formation of the copper layer, after desmearing and electroless copper plating were performed, an electroplating copper layer having a thickness of 18 μm was formed on the resulting electroless plating copper layer. After drying at 180° C. for 30 minutes, adhesion strength was measured in a normal state and after a pressure cooker test (PCT) according to JPCA-BU01-1998 (issued by Japan Electronics Packaging and Circuits Association). Desmearing and electroless copper plating were performed by the same processes as those in Example 1.

Adhesion strength in normal state: adhesion strength measured after left to stand for 24 hours at a temperature of 25° C. and a humidity of 50%.
PCT: adhesion strength measured after left to stand for 96 hours at a temperature of 121° C. and a humidity of 100%.

[Measurement of Surface Roughness Ra]

Measurement was performed by the same process as that in Example 1.

[Determination of Thermoplastic Polyimide]

Determination was performed by the same process as that in Example 15.

[Evaluation of Laminatability]

The layer B of an insulating sheet including the layer A covered with a fluorocarbon resin film (trade name: AFLEX, manufactured by Asahi Glass Co. Ltd.) serving as a protective film was allowed to face a circuit-forming surface of a glass epoxy substrate (trade name: RISHOLITE CS-3665, manufactured by Risho Kogyo Co., Ltd., thickness of copper foil: 18 μm, total thickness: 0.6 mm) having a circuit with a height of 18 μm, a circuit width of 50 μm, and a circuit spacing of 50 μm, and heat and pressure were applied for 60 minutes at a temperature of 180° C. and a pressure of 3 MPa under vacuum. Then, the fluorocarbon resin film was separated to obtain a laminate including an insulating sheet/glass epoxy substrate structure. The exposed surface of the resin was visually observed using an optical microscope (magnification: 50 times) to check whether or not bubbles were included in the space between the circuits. Laminatability was evaluated according to the following criteria:

Pass (P): No inclusion of bubbles was observed in the space between the circuits (in the space between the circuits, a portion in which the resin does not enter).
Failure (F): Inclusion of bubbles was observed.

(Measurement of Coefficient of Linear Expansion)

An insulating sheet including a layer A/layer C/layer B structure was subjected to hot pressing (180° C. for 1 hour) to cure a thermosetting component, thus producing a cured sheet. The resulting cured sheet was dried at 180° C. for 30 minutes to prepare a sample. The measurement of the sample having a length of 15 mm and a width of 5 mm was performed at a tensile load of 3 g by heating from room temperature to 200° C. at a heating rate of 10° C./min with a measurement apparatus (TMA120C, manufactured by Seiko Instruments Inc.), and the sample was cooled. This operation releases residual stress in the sample. Then, the measurement is performed by heating from room temperature to 270° C. again. In this second measurement, a temperature at an inflection point in a temperature-dimension curve was defined as a glass transition temperature (Tg). The mean coefficient of linear expansion between room temperature and Tg–10° C. was defined as the coefficient of linear expansion of the sample.

(Measurement of Melt Viscosity)

The specimen, having a diameter of 25 mm and a thickness of 0.5 mm, of a resin sheet including the B-stage layer B was heated from 60° C. to 180° C. at a heating rate of 12° C./min with a measurement apparatus (Rheometer CVO, manufactured by BOHLIN). The temperature was then maintained at 180° C. for 1 hour. A change in the complex viscosity coefficient of the specimen was observed from the initiation of heating, and the minimum value was defined as the melt viscosity of the specimen.

(Measurement of Elastic Modulus)

Tensile modulus was measured according to the standard D882-81 of ASTM.

Example 20

The non-thermoplastic polyimide film (b) prepared by the above-described process was used as the layer C. The solution (33) obtained above was flow-cast onto one surface of the layer C. The flow-cast solution was dried at 60° C., 100° C., and 150° C. for 2 minutes each with a hot-air oven to produce the layer A having a thickness of 5 μm. Subsequently, the solution for forming the layer B prepared by the above-described process was flow-cast onto the other surface of the layer C such that the thickness of the layer B was 40 μm after drying. The flow-cast solution was dried 80° C., 100° C., 120° C., and 150° C. for 1 minute each with a hot-air oven. Thereby, an inventive insulating sheet including a layer A (5 μm)/layer C (13 μm)/layer B (40 μm) structure was obtained. A laminate including a insulating sheet/glass epoxy substrate structure was produced using the resulting sheet, and adhesion was evaluated.

The resulting laminate including an insulating sheet/glass epoxy substrate structure and the insulating sheet were evaluated according to the evaluation procedures of various evaluation items. Table 9 shows the evaluation results.

Examples 21 to 23

Insulating sheets according to the present invention were produced by the same procedure as that in Example 20 except that the solutions (34) to (36) produced by the above-described processes were used as the layer A-forming solutions. The resulting sheet and laminate including an insulating sheet/glass epoxy substrate structure were evaluated as in Example 20 according to the evaluation procedures of various evaluation items. Table 9 shows the evaluation results.

Examples 24 to 26

Insulating sheets according to the present invention were produced by the same procedure as that in Example 22 except that the solution (35) was used as each layer A-forming solution, a fused silica filler was not incorporated in each layer B, and the thicknesses of the layers Bs were 15, 20, and 40 μm, respectively. The resulting sheet and laminate including an insulating sheet/glass epoxy substrate structure were evaluated as in Example 20 according to the evaluation procedures of various evaluation items. Table 9 shows the evaluation results.

Comparative Example 7

An insulating sheet according to the present invention was produced by the same procedure as that in Example 20 but without a solution for forming the layer A. The resulting sheet and laminate including an insulating sheet/glass epoxy substrate structure were evaluated as in Example 20 according to the evaluation procedures of various evaluation items. Table 10 shows the evaluation results.

TABLE 9

|  | Ex. 20 | Ex. 21 | Ex. 22 | Ex. 23 | Ex. 24 | Ex. 25 | Ex. 26 |
|---|---|---|---|---|---|---|---|
| layer A | (16) | (17) | (18) | (19) | (18) | (18) | (18) |
| layer C | (c) | (c) | (c) | (c) | (c) | (c) | (c) |
| Layer B | S: (33) | S: (33) | S: (33) | S: (33) | S: (33) | S: (33) | S: (33) |
|  | F: Yes | F: Yes | F: Yes | F: Yes | F: No | F: No | F: No |
|  | T: 40 | T: 40 | T: 40 | T: 40 | T: 15 | T: 20 | T: 40 |
| Metal Layer Formation | D & E | D & E | D & E | D & E | D & E | D & E | D & E |
| Strength in Normal State | 9 N/cm | 9 N/cm | 8 N/cm | 8 N/cm | 8 N/cm | 8 N/cm | 8 N/cm |
| Post-PCT Adhesion Strength | 8 N/cm | 8 N/cm | 6 N/cm | 6 N/cm | 6 N/cm | 6 N/cm | 6 N/cm |
| Surface Roughness Ra | 0.03 μm | 0.03 μm | 0.03 μm | 0.03 μm | 0.03 μm | 0.03 μm | 0.03 μm |
| Lamination Property | P | P | P | P | P | P | P |
| Linear Expansion Coefficient | 37 ppm | 36 ppm | 35 ppm | 35 ppm | 28 ppm | 30 ppm | 47 ppm |
| Melt Viscosity of Layer C | 600 Pa·s | 600 Pa·s | 600 Pa·s | 600 Pa·s | 60 Pa·s | 60 Pa·s | 60 Pa·s |

Abbreviation:
S stands for solution;
F stands for filler and Yes indicates that the filler was added and No indicates that the filler was not added;
T stands for thickness in the unit of μm; and
D & E stands for Desmearing and Electroless Plating.

Comparative Example 8

An insulating sheet according to the present invention was produced by the same procedure as that in Example 20 except that the solution (37) produced by the above-described process was used as the solution for forming the layer A. The resulting sheet and laminate including an insulating sheet/glass epoxy substrate structure were evaluated as in Example 20 according to the evaluation procedures of various evaluation items. Table 10 shows the evaluation results.

TABLE 10

|  | Com. Ex. 7 | Com. Ex. 8 |
|---|---|---|
| layer A | None | (20) |
| layer C | (c) | (c) |
| Layer B | S: layer C resin Solution | S: layer C resin Solution |
|  | F: Yes | F: Yes |
|  | T: 40 | T: 40 |
| Metal Layer Formation | D & E | D & E |
| Strength in Normal State | 1 N/cm or less | 2 N/cm |
| Post-PCT Adhesion Strength | 1 N/cm or less | 0.5 N/cm |
| Surface Roughness Ra | 0.03 μm | 0.03 μm |
| Lamination Property | P | P |

TABLE 10-continued

|  | Com. Ex. 7 | Com. Ex. 8 |
|---|---|---|
| Linear Expansion Coefficient | 35 ppm | 35 ppm |
| Melt Viscosity of Layer C | 600 Pa·s | 600 Pa·s |

Abbreviation:
S stands for solution;
F stands for filler and Yes indicates that the filler was added and No indicates that the filler was not added;
T stands for thickness in the unit of μm; and
D & E stands for Desmearing and Electroless Plating.

Examples 27 to 29

Insulation sheets were produced as in Example 22 except that the thicknesses of the layers B were 15 μm, 20 μm, and 30 μm, respectively. Table 11 shows the coefficients of linear expansion of the resulting insulating sheets.

TABLE 11

|  | Ex. 27 | Ex. 28 | Ex. 29 | Ref. Ex. 2 |
|---|---|---|---|---|
| layer A | (18) | (18) | (18) | (18) |
| Layer C | (c) | (c) | (c) | None |
| Layer B | S: layer C resin Solution | S: layer C resin Solution | S: layer C resin Solution | S: layer C resin Solution |
|  | F: Yes | F: Yes | F: Yes | F: Yes |
|  | T: 15 | T: 20 | T: 30 | T: 40 |
| Linear Expansion Coefficient | 27 ppm | 29 ppm | 31 ppm | 48 ppm |

Abbreviation:
S stands for solution;
F stands for filler and Yes indicates that the filler was added and No indicates that the filler was not added; and
T stands for thickness in the unit of μm.

Reference Example 2

The solution (35) was applied onto a PET film serving as a support, and the solution (37) was applied thereon, followed by drying to produce an insulating sheet including a layer A/layer B structure, with no use of the layer C (non-thermoplastic film). The coefficient of linear expansion of the resulting sheet was evaluated. Table 11 shows the result.

In the following Examples 30 to 40, as characteristics of insulating sheets or metal foil-clad insulating sheets in semi-cured states, flowability, laminatability, and the contents of volatile components were evaluated or calculated as described below. Furthermore, as characteristics of insulating sheets or metal foil-clad insulating sheets in cured states, adhesion, surface roughness, linear expansion coefficients, dielectric characteristics, glass transition temperatures, and surface states observed were evaluated as described below.

With respect to the evaluations of the characteristics of the cured products, an insulating sheet or a metal foil-clad insulating sheet was interposed between glossy surfaces of rolled-copper foils (trade name: BHY-22B-T, manufactured by Japan Energy Corporation) each having a thickness of 18 μm. Then, heat and pressure were applied for 1 hour at a temperature of 180° C. and a pressure of 3 MPa to obtain a laminate including the insulating sheet between the rolled-copper foils. The copper foils of the resulting laminate were removed by etching to obtain a cured resin sheet, and the characteristics were evaluated.

[Evaluation of Adhesion]

The outermost layer B of an insulating sheet was allowed to face a glass epoxy substrate FR-4 (product ID: MCL-E-67, manufactured by Hitachi Chemical Co., Ltd.; thickness of copper foil: 50 μm, total thickness: 1.2 mm), and the outermost layer A was allowed to face a roughened surface of a copper foil (product ID: BHY22BT, manufactured by Japan Energy Corporation) or an easy-release polyester film (thickness: 125 μm, trade name: Cerapeel HP, manufactured by Toyo Metallizing Co. Ltd.). Heat and pressure were applied for 1 hour at a temperature of 180° C. and a pressure of 3 MPa under vacuum to obtain a laminate. In the case of a metal foil-clad insulating sheet, a laminate was also produced in the same way. When the copper foil was used, a copper layer was formed on a roughened surface obtained by removing the copper foil by etching. When a polyester film was used, a copper layer was formed on the surface of the outermost layer A exposed by separating the film. With respect to the copper layer, after performing desmearing and electroless copper plating, an electroplating copper layer 18 μm in thickness was formed on the electroless plating copper layer. Then, drying was performed at 180° C. for 30 minutes. Subsequently, peel strength was measured according to JPCA-BU01-1998 (issued by Japan Electronics Packaging and Circuits Association). Desmearing and electroless copper plating were performed by the same processes as those in Example 1.

Adhesion strength in normal state: adhesion strength measured after left to stand for 24 hours at a temperature of 25° C. and a humidity of 50%.

[Measurement of Surface Roughness Ra]

Measurement was performed by the same process as that in Example 1.

[Evaluation of Flowability]

With respect to insulating adhesive sheets or metal foil-clad insulating adhesive sheets before heat curing, using a dynamic viscoelastometer (CVO, manufactured by Bohlin) in the shear mode, the complex viscosity (Pa·s) was measured under the conditions described below, and melt viscosity was determined from the resulting complex viscosity. The melt viscosity of each insulating adhesive sheet was evaluated on the basis of the minimum melt viscosity in the range of 60° C. to 200° C. Melt viscosity was a property according to the outermost layer B. In Examples of the present invention, a resin sheet consisting of the outermost layer B alone was produced for measuring flowability.

Measurement frequency: 1 Hz

Hating rate: 12° C./min

Sample measured: Circular resin sheet with a diameter of 3 mm

[Evaluation of Laminatability]

The outermost layer B of an insulating sheet was allowed to face a circuit-forming surface of a glass epoxy substrate FR-4 (product ID: MCL-E-67, manufactured by Hitachi Chemical Co., Ltd.; thickness of copper foil: 50 μm, total thickness: 1.2 mm) having a circuit with a height of 18 μm, a circuit width of 50 μm, and a circuit spacing of 50 μm, and the outermost layer A was allowed to face a copper foil (product ID: BHY22BT, manufactured by Japan Energy Corporation). Heat and pressure were applied for 1 hour at a temperature of 180° C. and a pressure of 3 MPa under vacuum to produce a laminate. In the case of a copper foil-clad insulating adhesive sheet, a laminate was also produced in the same way. The copper foil of the resulting laminate was chemically removed using an iron (III) chloride-hydrochloric acid solution. The exposed surface of the resin was visually observed with an optical microscope (magnification: 50 times) to check whether or not bubbles were included in the space between the circuits. Laminatability was evaluated according to the following criteria:

Pass (P): No inclusion of bubbles was observed in the space between the circuits (in other words, no portion in which the resin does not enter was observed in the space between the circuits).

Failure (F): Inclusion of bubbles was observed.

[Measurement of Content of Volatile Component in Resin Sheet]

Using a weight meter (trade name: TGA50, manufactured by Shimadzu Corporation), an insulating adhesive sheet was placed in a sample pan, and a change in weight was measured under the conditions described below. The content of a volatile component was determined as the ratio of the decrease in weight in the temperature range of 100° C. to 300° C. to the weight of the insulating adhesive sheet before the change. In the case of a metal foil-clad insulating adhesive sheet, an insulating adhesive sheet was produced by the same procedure as that described above except that the metal foil was changed to a polyester film (thickness: 125 μm, trade name: Cerapeel HP, manufactured by Toyo Metallizing Co. Ltd.), and a change in weight was measured in the same way.

Measurement temperature range: 15° C. to 350° C.

Heating rate: 20° C./min

Measurement atmosphere: Nitrogen, flow rate: 50 mL/min

Sample pan: Composed of aluminum

[Measurement of Linear Expansion Coefficient (TMA Measurement)]

Linear expansion coefficient was measured as in Example 9.

[Evaluation of Dielectric Characteristics]

Using a cavity resonator for complex permittivity measurement in perturbation method (trade name, manufactured by Kanto Electronics Application and Development Inc.), the dielectric constant and dielectric loss tangent were measured under the following conditions:

Measurement frequency: 5 GHz

Measurement temperature: 22° C. to 24° C.

Measurement humidity: 45% to 55%

Sample measured: A cured resin sheet left to stand for 24 hours at the above-described measurement temperature and humidity

[Measurement of Glass Transition Temperature]

Using a DMS-200 (product ID, manufactured by Seiko Instruments & Electronics Ltd.), a cured resin sheet was measured at a measurement length (fixture gap) of 20 mm under the conditions described below. A peak temperature in the temperature dispersion spectrum of tan δ (=∈'/∈") was determined as a glass transition temperature (° C.).
Measurement atmosphere: Dry air atmosphere
Measurement temperature: 20° C. to 400° C.
Sample measured: Cured resin sheet strip having a width of 9 mm and a length of 40 mm
[Surface Observation]
In the procedure of preparing a sample for measuring peel strength described above, a sample after chemical plating was etched. The surface morphology observation and elemental analysis were performed using SEM/EDX.

Synthesis Example 16 of Polyimide Resin

Into a 2,000-mL glass flask charged with dimethylformamide (DMF), 0.95 equivalents of 1,3-bis(3-aminophenoxy)benzene (APB) and 0.05 equivalents of 3,3'-dihydroxy-4,4'-diaminobiphenyl (manufactured by Wakayama Seika Kogyo Co., Ltd.) were fed and dissolved under stirring in a nitrogen atmosphere to prepare a DMF solution. Subsequently, after the flask was purged with nitrogen, the DMF solution was cooled in ice under stirring, and 1 equivalent of 4,4'-(4,4'-isopropylidenediphenoxy)bis(phthalic anhydride) (IPBP, manufactured by General Electric Company) was added thereto. The resulting mixture was stirred further for 3 hours to obtain a polyamic acid solution. The amount of DMF used was set such that the content of the monomers fed was 30 percent by weight, the monomers being APB, 3,3'-dihydroxy-4,4'-diaminobiphenyl, and IPBP.

Next, 300 g of the polyamic acid solution was transferred to a vat coated with a fluorocarbon resin, reduced pressure heating was performed in a vacuum oven for 3 hours at 200° C. and 5 mmHg (about 0.007 atmospheric pressure, about 5.65 hPa) to obtain a polyimide resin 16.

Synthesis Example 17 of Polyimide Resin

A KF-8010 (62 g, 0.075 mol) (manufactured by Shin-Etsu Chemical Co., Ltd.), 4,4'-diaminodiphenyl ether (15 g, 0.075 mol), and N,N-dimethylformamide (hereinafter referred to as "DMF") were fed into a 2,000-mL glass flask and dissolved under stirring. Then, 4,4'-(4,4'-isopropylidenediphenoxy)bis(phthalic anhydride) (78 g, 0.15 mol) was added thereto. The resulting mixture was stirred at 20° C. for about 1 hour to prepare a DMF solution of a polyamic acid having a solid content of 30%. The resulting polyamic acid solution was transferred to a vat coated with Teflon (registered trademark) and heated in a vacuum oven at 200° C. for 120 minutes under a reduced pressure of 665 Pa to obtain a polyimide resin 17.

Preparation Example 21 of Solution for Forming Layer A

The polyimide resin 16 was dissolved or dispersed in dioxolane to prepare a solution (39) for forming the layer A. The solid content was set to 15 percent by weight.

Preparation Example 22 of Solution for Forming Layer A

The polyimide resin 17 was dissolved or dispersed in dioxolane to prepare a solution (40) for forming the layer A. The solid content was set to 15 percent by weight.

Preparation Example 6 of Solution for Forming Layer B

Components shown in Tables 12 and 13 were dissolved or dispersed in dioxolane in mixing ratios shown in Tables 12 and 13 to prepare a solution for forming the layer B. The solid content was set to 35 percent by weight.

Example 30

The resin solution for forming the outermost layer A shown in Table 12 was flow-cast onto a roughened surface of a rolled-copper foil (thickness: 18 μm, trade name: BHY-22B-T, manufactured by Japan Energy Corporation) to be a support as shown in Table 12. The resulting flow-cast solution was dried at 80° C., 100° C., 120° C., 150° C., and 170° C. for 1 minute each with a hot-air oven to produce an outermost layer A 5 μm in thickness. Subsequently, the resin solution for forming the outermost layer B shown in Table 1 was flow-cast onto the surface of the outermost layer A. The flow-cast solution was dried at 80° C., 100° C., 120° C., 150° C., and 170° C. for 1 minute each with a hot-air oven to produce an inventive metal foil-clad insulating adhesive sheet including the layer A and the layer B, the sum of the thicknesses of the layer A and the layer B being 40 μm. The resulting sheet was evaluated according to evaluation procedures of various evaluation items. Table 12 shows the evaluation results.

Examples 31 to 41

According to items of "solution for forming outermost layer A", "solution for forming outermost layer B", "support", and "thickness" shown in Tables 12 and 13, insulating adhesive sheets or metal foil-clad insulating adhesive sheet of the present invention were produced by the same processes as those in Example 30. The resulting sheets were evaluated according to evaluation procedures of various evaluation items. Tables 12 and 13 show the evaluation results. Tables 15 to 17 show percent by volume and percent by weight of an inorganic filler.

TABLE 12

|  | Ex. 30 | | Ex. 31 | | Ex. 32 | | Ex. 33 | | Ex. 34 | | Ex. 35 | |
|---|---|---|---|---|---|---|---|---|---|---|---|---|
| Solution for forming Outermost Layer A | Sol. (39) | 100 g | Sol. (39) | 100 g | Sol. (39) | 100 g | Sol. (39) | 100 g | Sol. (39) Silica | 90 g 10 g | Sol. (39) Thiol | 100 g 0.5 g |
| Solution for forming Outermost Layer B | Sol. (39) YX4000H BAPS-M C11Z-A Silica | 50 g 32.1 g 17.9 g 0.2 g 50 g | Sol. (39) YX4000H BAPS-M C11Z-A Silica | 50 g 32.1 g 17.9 g 0.2 g 50 g | Sol. (39) YX4000H BAPS-M C11Z-A Silica | 50 g 32.1 g 17.9 g 0.2 g 50 g | Sol. (39) YX4000H BAPS-M C11Z-A Silica | 50 g 32.1 g 17.9 g 0.2 g 50 g | Sol. (39) YX4000H BAPS-M C11Z-A Silica | 50 g 32.1 g 17.9 g 0.2 g 50 g | Sol. (39) YX4000H BAPS-M C11Z-A Silica | 50 g 32.1 g 17.9 g 0.2 g 50 g |
| Supporter for use in Forming Sheet | Copper Foil | | Copper Foil | | PET | | PET | | PET | | PET | |
| Thickness of Outermost Layer A | 20 μm | | 5 μm | | 5 μm | | 5 μm | | 5 μm | | 5 μm | |
| Thickness of Outermost Layer B | 20 μm | | 35 μm | | 35 μm | | 35 μm | | 35 μm | | 35 μm | |

TABLE 12-continued

|  | Ex. 30 | Ex. 31 | Ex. 32 | Ex. 33 | Ex. 34 | Ex. 35 |
|---|---|---|---|---|---|---|
| Min. Viscosity/Pa · s (Outermost Layer B) | 500 | 500 | 500 | 500 | 500 | 500 |
| Lamination Property | P | P | P | P | P | P |
| Volatile Content | 1.5% | 1.0 | 1.0 | 1.0 | 1.0 | 1.0 |
| CTE | 55 ppm | 48 | 48 | 48 | 47 | 48 |
| Dielectric Property | 2.9/0.007 | 3.0/0.008 | 3.0/0.008 | 3.0/0.008 | 3.0/0.008 | 3.0/0.008 |
| Glass Transition Temp. | 165° C. | 167° C. | 167° C. | 167° C. | 170° C. | 166° C. |
| Adhesion Strength | 9 N/cm | 9 | 8 | 7 | 7 | 8 |
| Material used in lamination step in measuring Adhesion Strength | Copper Foil | Copper Foil | Copper Foil | PET | Copper Foil | PET |
| Surface Roughness Ra μm | 0.18 | 0.18 | 0.17 | 0.13 | 0.19 | 0.15 |
| Surface Observation | No Silica etc. Found | No Silica etc. Found | No Silica etc. Found | No Silica etc. Found | No Silica etc. Found | No Silica etc. Found |

Abbreviation:
Sol. stands for Solution.

Note:
The weights in the table are solid content in weight.

TABLE 13

|  | Ex. 36 | Ex. 37 | Ex. 38 | Ex. 39 | Ex. 40 | Ex. 41 |
|---|---|---|---|---|---|---|
| Solution for forming Outermost Layer A | Sol. (39) 100 g | Sol. (39) 100 g | Sol. (39) 100 g | Sol. (39) 50 g YX4000H 32.1 g BAPS-M 17.9 g C11Z-A 0.2 g | P.R. 50 g N660 31.1 g NC30 18.9 g C11Z-A 0.2 g | Sol. (40) 100 g |
| Solution for forming Outermost Layer B | Sol. (39) 50 g YX4000H 32.1 g BAPS-M 17.9 g C11Z-A 0.2 g Silica 100 g | ULTEM 50 g YX4000H 32.1 g BAPS-M 17.9 g C11Z-A 0.2 g Silica 50 g | Sol. (39) 50 g N660 31.1 g NC30 18.9 g C11Z-A 0.2 g Silica 50 g | Sol. (39) 50 g YX4000H 32.1 g BAPS-M 17.9 g C11Z-A 0.2 g Silica 50 g | P.R. 50 g N660 31.1 g NC30 18.9 g C11Z-A 0.2 g Silica 100 g | Sol. (39) 50 g YX4000H 32.1 g BAPS-M 17.9 g C11Z-A 0.2 g Silica 50 g |
| Supporter for use in Forming Sheet | Copper Foil | PET | Copper Foil | PET |  | PET |
| Thickness of Outermost Layer A | 5 μm | 5 μm | 5 μm | 5 μm | 5 | 5 μm |
| Thickness of Outermost Layer B | 35 μm | 35 μm | 35 μm | 35 μm | 35 | 35 μm |
| Min. Viscosity/Pa · s (Outermost Layer B) | 2200 | 550 | 4500 | 500 | 300 | 500 |
| Lamination Property | P | P | P | P | P | P |
| Volatile Content | 0.8% | 1.0 | 1.0 | 1.0 | 1.4 | 1.3 |
| CTE | 37 | 45 | 49 | 48 | 50 | 57 ppm |
| Dielectric Property | 3.2/0.007 | 2.9/0.008 | 3.1/0.010 | 3.1/0.012 | 3.3/0.023 | 2.9/0.007 |

|  | Ex. 30 | Ex. 31 | Ex. 32 | Ex. 33 | Ex. 34 | Ex. 35 |
|---|---|---|---|---|---|---|
| Glass Transition Temp. | 170° C. | 190° C. | 175° C. | 167° C. | 160° C. | 160° C. |
| Adhesion Strength | 9 | 8 | 9 | 9 | 9 | 11 N/cm |
| Material used in lamination step in measuring Adhesion Strength | Copper Foil | Copper Foil | Copper Foil | Copper Foil | PET | PET |
| Surface Roughness Ra μm | 0.18 | 0.17 | 0.18 | 0.17 | 1.0 | 0.18 |
| Surface Observation | No Silica etc. Found | No Silica etc. Found | No Silica etc. Found | No Silica etc. Found | No Silica etc. Found | No Silica etc. Found |

Abbreviation:
Sol. stands for Solution.
P.R. stands for Phenoxy Resin

Note:
The weights in the table are solid content in weight.

Comparative Examples 9 and 10

According to items of "solution for forming outermost layer A", "solution for forming outermost layer B", "support", and "thickness" shown in Table 14, insulating adhesive sheets or metal foil-clad insulating adhesive sheet of the present invention were produced by the same processes as those in Example 1. The resulting sheets were evaluated according to evaluation procedures of various evaluation items. Table 14 shows the evaluation results. Tables 15 to show percent by volume and percent by weight of an inorganic filler.

TABLE 14

|  | Com. Ex. 9 | | Com. Ex. 10 | |
|---|---|---|---|---|
| Solution for forming Outermost Layer A | Sol. (39) Silica | 50 g 50 g | None | |
| Solution for forming Outermost Layer B | ULTEM YX4000H BAPS-M C11Z-A Silica | 50 g 32.1 g 17.9 g 0.2 g 50 g | ULTEM YX4000H BAPS-M C11Z-A Silica | 50 g 32.1 g 17.9 g 0.2 g 50 g |
| Supporter for use in Forming Sheet | Copper Foil | | Copper Foil | |
| Thickness of Outermost Layer A | 5 μm | | — | |
| Thickness of Outermost Layer B | 35 μm | | 40 μm | |
| Min. Viscosity/Pa · s (Outermost Layer B) | 500 | | 2200 | |
| Lamination Property | P | | P | |
| Volatile Content | 1.0 | | 0.8 | |
| CTE | 44 | | 33 | |
| Dielectric Property | 3.1/0.010 | | 3.3/0.006 | |
| Glass Transition Temp. | 187° C. | | 192° C. | |
| Adhesion Strength | 5 | | 4 | |
| Material used in lamination step in measuring Adhesion Strength | Copper Foil | | Copper Foil | |
| Surface Roughness Ra μm | 0.21 | | 0.23 | |
| Surface Observation | Silica Exposed | | Silica Exposed | |

Abbreviation:
Sol. stands for Solution.
Note:
The weights in the table are solid content in weight.

Silica; Admafine S0-C5, manufactured by Tatsumori, Average Particle size=1.5 μm

Thiol; disnet DB (2-butylamino-4,6-dimercapto-s-triazine), manufactured by Sankyo Chemical Co. Ltd.

ULTEM; ULTEM 1010, manufactured by Japan GE Plastics

N660; Cresol Novolac type epoxy resin, manufactured by Dainippon Ink and Chemicals Incorporated.

YX4000H; Biphenyl type Epoxy Resin, manufactured by Japan Epoxy Resin Co., Ltd.

BAPS-M; Bis[4-(3-aminophenoxy)phenyl]sulfone, manufactured by Wakayama Seika Kogyo Co., Ltd.

C11Z-A; 2,4-diamino-6-[2'-undecylimidazolyl-(1')]-ethyl-s-triazine, manufactured by Shikoku Chemicals Corp.

NC30; Phenol resin, manufactured by Gun Ei chemical industry Co., Ltd.

Phenoxy Resin: YP-50, manufactured by Tohto Kasei Co. Ltd.

TABLE 15

|  | Ex. 30 | Ex. 31 | Ex. 32 | Ex. 33 | Ex. 34 | Ex. 35 |
|---|---|---|---|---|---|---|
| wt % of Silica in A/wt % of Silica in B | 0 | 0 | 0 | 0 | 0.3 | 0 |
| vol. % of Silica on surface of A/vol. % of Silica on surface of B | 0 | 0 | 0 | 0 | 0.27 | 0 |

TABLE 16

|  | Ex. 36 | Ex. 37 | Ex. 38 | Ex. 39 | Ex. 40 | Ex. 41 |
|---|---|---|---|---|---|---|
| wt % of Silica in A/wt % of Silica in B | 0 | 0 | 0 | 0 | 0 |  |
| vol. % of Silica on surface of A/vol. % of Silica on surface of B | 0 | 0 | 0 | 0 | 0 |  |

TABLE 17

|  | Com. Ex. 9 | Com. Ex. 10 |
|---|---|---|
| wt % of Silica in A/wt % of Silica in B | 1.5 | 1.5 |
| vol. % of Silica on surface of A/vol. % of Silica on surface of B | 1.63 | 1.00 |

The present invention is not limited to the features described above, and various changes may be made within the scope of the following claims. The technical scope of the present invention also includes embodiments and examples obtained by appropriately combining technical means disclosed in different embodiments and examples.

INDUSTRIAL APPLICABILITY

The present invention provides a component having high adhesion strength to an electroless plating layer even when the surface roughness is small, the component having a surface a for electroless plating, the surface a being composed of a polyimide resin having a predetermined structure. Therefore, the component can be applied to various plating materials.

Furthermore, in the case of an insulating sheet including at least two layers containing the layer A, in order to satisfy characteristics required for use in a printed circuit board, the insulating sheet has well-balanced characteristics by separating the functions. In the case of the insulating sheet containing an inorganic filler, by adjusting the content of the inorganic filler in a surface layer for electroless plating, the insulating sheet not only can be strongly bonded to an electroless plating copper because of low surface roughness but also has low linear expansivity. Thus, these sheets can be suitably used in, for example, producing printed circuit boards. Therefore, the insulating sheets of the present invention can be suitably used in the electronic component industry in addition to the material processing industry of materials, such as resin compositions and adhesives, and the chemical industry.

The invention claimed is:

1. A printed circuit board comprising:

a printed circuit comprising an electroless plating layer, and an insulation sheet comprising a layer A having a surface a in direct contact with the electroless plating layer;

wherein the printed circuit comprises fine lines with a line and space (L/S)=10 μm/10 μm or less, wherein the surface a has a roughness of 0.5 μm or less in terms of arithmetic average roughness measured with a cutoff value of 0.002 mm, and wherein the layer A comprises a polyimide resin having a siloxane structure.

\* \* \* \* \*